United States Patent
Thompson et al.

(10) Patent No.: US 12,239,015 B2
(45) Date of Patent: Feb. 25, 2025

(54) ENERGY SENSITIZATION OF ACCEPTORS AND DONORS IN ORGANIC PHOTOVOLTAICS

(71) Applicant: University of Southern California, Los Angeles, CA (US)

(72) Inventors: Mark E. Thompson, Anaheim, CA (US); Cong Trinh, Los Angeles, CA (US); Peter I. Djurovich, Long Beach, CA (US); Sarah M. Conron, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 16/526,083

(22) Filed: Jul. 30, 2019

(65) Prior Publication Data

US 2020/0203638 A1 Jun. 25, 2020

Related U.S. Application Data

(63) Continuation of application No. 14/433,046, filed as application No. PCT/US2013/063661 on Oct. 7, 2013, now Pat. No. 10,367,157.

(60) Provisional application No. 61/710,504, filed on Oct. 5, 2012.

(51) Int. Cl.

| | | |
|---|---|---|
| *H01L 51/00* | (2006.01) | |
| *B82Y 10/00* | (2011.01) | |
| *C09B 47/00* | (2006.01) | |
| *C09B 57/10* | (2006.01) | |
| *H01L 51/42* | (2006.01) | |
| *H10K 30/20* | (2023.01) | |
| *H10K 85/20* | (2023.01) | |
| *H10K 85/30* | (2023.01) | |
| *H10K 30/81* | (2023.01) | |
| *H10K 50/11* | (2023.01) | |
| *H10K 101/30* | (2023.01) | |
| *H10K 101/40* | (2023.01) | |

(52) U.S. Cl.
CPC ............ *H10K 85/381* (2023.02); *B82Y 10/00* (2013.01); *C09B 47/00* (2013.01); *C09B 57/10* (2013.01); *H10K 30/20* (2023.02); *H10K 85/211* (2023.02); *H10K 85/322* (2023.02); *H10K 85/342* (2023.02); *H10K 30/81* (2023.02); *H10K 50/11* (2023.02); *H10K 85/215* (2023.02); *H10K 85/30* (2023.02); *H10K 2101/30* (2023.02); *H10K 2101/40* (2023.02); *Y02E 10/549* (2013.01)

(58) Field of Classification Search
CPC .... H10K 85/381; H10K 85/322; H10K 30/20; H10K 85/342; H10K 85/211; H10K 30/81; H10K 2101/40; H10K 2101/30; H10K 50/11; H10K 85/215; H10K 85/30; B82Y 10/00; C09B 47/00; C09B 57/10; Y02E 10/549
USPC ........................................................ 136/263
See application file for complete search history.

(56) References Cited

U.S. PATENT DOCUMENTS

| | | |
|---|---|---|
| 2004/0254383 A1 | 12/2004 | Yu et al. |
| 2006/0060239 A1 | 3/2006 | Peumans et al. |
| 2007/0272918 A1 | 11/2007 | Rand et al. |
| 2009/0235971 A1 | 9/2009 | Pfeiffer et al. |
| 2010/0065112 A1 | 3/2010 | Thompson et al. |
| 2010/0084011 A1 | 4/2010 | Forrest et al. |
| 2012/0211082 A1 | 8/2012 | Akiyama et al. |
| 2013/0104968 A1 | 5/2013 | Pfeiffer et al. |

FOREIGN PATENT DOCUMENTS

| | | |
|---|---|---|
| CN | 101548404 A | 3/2012 |
| CN | 102473843 A | 5/2012 |
| EP | 2385556 A1 | 11/2011 |
| JP | 2007134444 A | 5/2007 |
| JP | 2008109097 A | 5/2008 |
| JP | 2008514013 A | 5/2008 |
| JP | 2008532302 A | 8/2008 |
| JP | 2012503315 A | 2/2012 |
| JP | 2012504343 A | 2/2012 |
| WO | WO2010075512 A1 | 7/2010 |
| WO | WO2012109232 A2 | 8/2012 |

OTHER PUBLICATIONS

Chen et al., "Fabrication and Performance of Copper Phthalocyanine / Squaraine Dye / Perylene Composite with Bulk Heterojunctions by the Solution Blending Process," Ind. Eng. Chem. Res., vol. 51, No. 9, pp. 3630-3638 (2012).

Deibel et al., "Role of the Charge Transfer State in Organic Donor-Acceptor Solar Cells," Advanced Materials, vol. 22, pp. 4097-4111 (2010).

(Continued)

*Primary Examiner* — Kristin A Vajda
(74) *Attorney, Agent, or Firm* — Finnegan, Henderson, Farabow, Garrett & Dunner, LLP

(57) ABSTRACT

Disclosed herein are organic photosensitive optoelectronic devices comprising acceptor and/or donor sensitizers to increase absorption and photoresponse of the photoactive layers of the devices. In particular, devices herein include at least one acceptor layer and at least one donor layer, wherein the acceptor layer may comprise a mixture of an acceptor material and at least one sensitizer, and the donor layer may comprise a mixture of a donor material and at least one sensitizer. Methods of fabricating the organic photosensitive optoelectronic devices are also disclosed.

10 Claims, 34 Drawing Sheets

(56) References Cited

OTHER PUBLICATIONS

Lee, "Charge Recombination in Organic Small-Molecule Solar Cells," Thesis, Dept. of Electrical Engineering and Computer Science, Massachusetts Institute of Technology, p. 24 (Table 3.1) (2008).
Trinh et al., "Efficient Energy Sensitization of C60 and Application to Organic Photovoltaics," JACS, vol. 135, pp. 11920-11928 (2013).
Veldman et al., "Photoinduced Charge and Energy Transfer in Dye-Doped Conjugated Polymers," Thin Solid Films, vol. 511-512, pp. 581-586 (2006).
Veldman et al., "The Energy of Charge-Transfer States in Electron Donor-Acceptor Blends: Insight into the Energy Losses in Organic Solar Cells," Advanced Functional Materials, vol. 19, pp. 1939-1948 (2009).
Wong et al., "Efficient photovoltaic cells with wide photosensitization range fabricated from rhenium benzathiazole complexes," Appl. Phys. Lett., vol. 90, No. 8, pp. 1-3 (2007).
Xiao et al., "Small-Molecule Photovoltaics Based on Functionalized Squaraine Donor Blends," Advanced Materials, vol. 24, pp. 1956-1960 (2012).
Xue et al., "A Hybrid Planar-Mixed Molecular Heterojunction Photovoltaic Cell," Adv. Materials, vol. 17, No. 1, pp. 66-71 (2005).

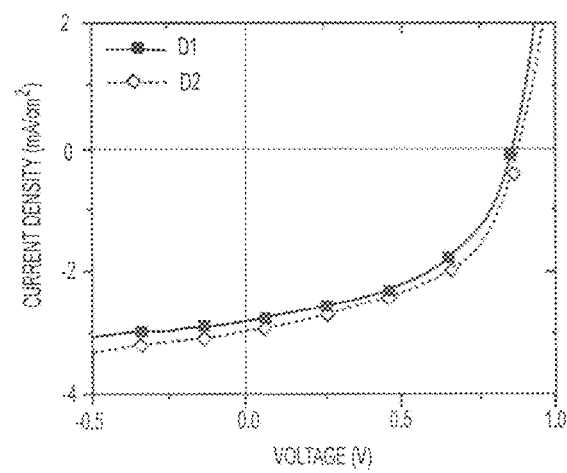 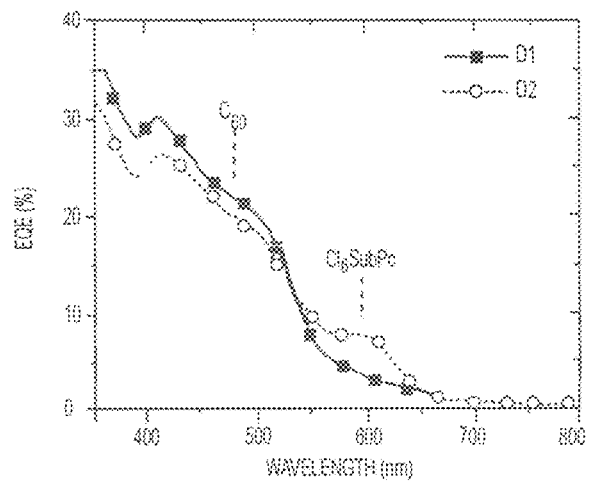
*FIG. 19A*  *FIG. 19B*

| DOPING LEVEL BY SENSITIZER VOLUME (%) | Jsc (mA/cm$^2$) | $V_{OC}$(V) | FF | $\eta$(%) |
|---|---|---|---|---|
| ZCl:C$_{60}$ | | | | |
| 17 | 2.92 | 0.88 | 0.46 | 1.17 |
| 0(*) | 2.91 | 0.86 | 0.41 | 1.03 |
| IrDP:C$_{60}$ | | | | |
| 17 | 2.98 | 0.84 | 0.49 | 1.25 |
| 0(*) | 2.75 | 0.84 | 0.45 | 1.05 |
| F$_{12}$SubPc:C$_{60}$ | | | | |
| 9 | 2.76 | 0.85 | 0.47 | 1.09 |
| 17 | 2.67 | 0.87 | 0.46 | 1.06 |
| 29 | 2.74 | 0.88 | 0.47 | 1.13 |
| 0(*) | 2.92 | 0.85 | 0.48 | 1.19 |
| Cl$_6$SubPc:C$_{60}$ | | | | |
| 17 | 2.87 | 0.86 | 0.44 | 1.11 |
| 0(*) | 2.76 | 0.86 | 0.44 | 1.04 |
| BCP:C$_{60}$ | | | | |
| 17 | 2.56 | 0.83 | 0.41 | 0.88 |
| 0(*) | 3.00 | 0.84 | 0.45 | 1.14 |

(*) REFERENCE DEVICES

*FIG. 20*

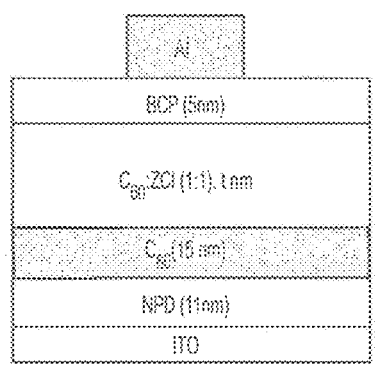
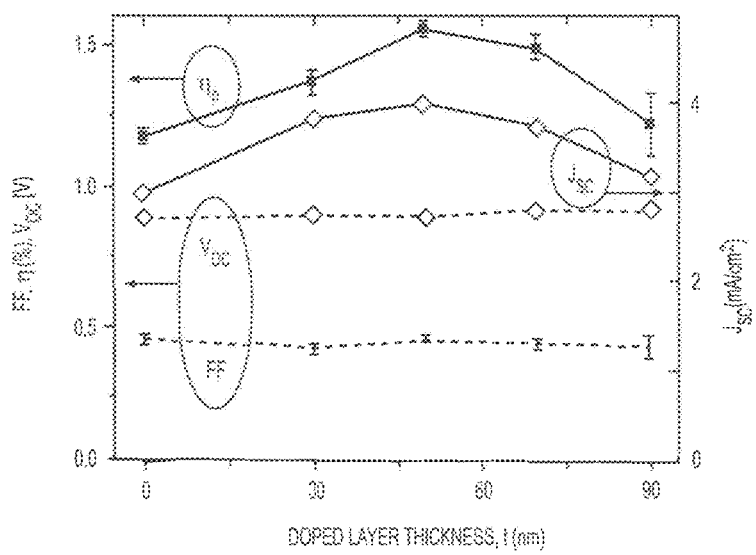
*FIG. 22A*

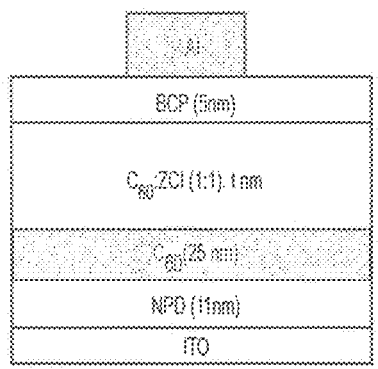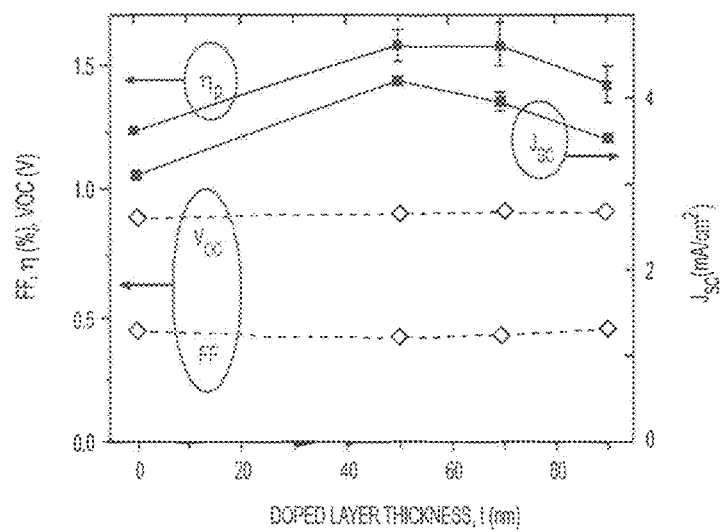
FIG. 22B

| THICKNESS OF ZCl:C$_{60}$ (1:1) LAYER (nm) | Jsc (mA/cm$^2$) | V$_{oc}$(V) | FF | η(%) |
|---|---|---|---|---|
| t=15 nm | | | | |
| 0 (REFERENCE) | 3.06 | 0.89 | 0.43 | 1.16 |
| 30 | 3.87 | 0.90 | 0.40 | 1.37 |
| 50 | 4.03 | 0.89 | 0.44 | 1.56 |
| 70 | 3.77 | 0.91 | 0.43 | 1.48 |
| 90 | 3.20 | 0.91 | 0.42 | 1.21 |
| t=25 nm | | | | |
| 0 (REFERENCE) | 3.15 | 0.90 | 0.44 | 1.25 |
| 50 | 4.23 | 0.91 | 0.41 | 1.58 |
| 70 | 3.96 | 0.91 | 0.44 | 1.58 |
| 90 | 3.53 | 0.91 | 0.45 | 1.42 |

*FIG. 22C*

| DEVICE | Jsc (mA/cm$^2$) | $V_{oc}$(V) | FF | $\eta$(%) |
|---|---|---|---|---|
| D1 | 5.88 | 0.76 | 0.53 | 2.39 |
| D2 | 6.71 | 0.77 | 0.51 | 2.62 |

*FIG. 23D*

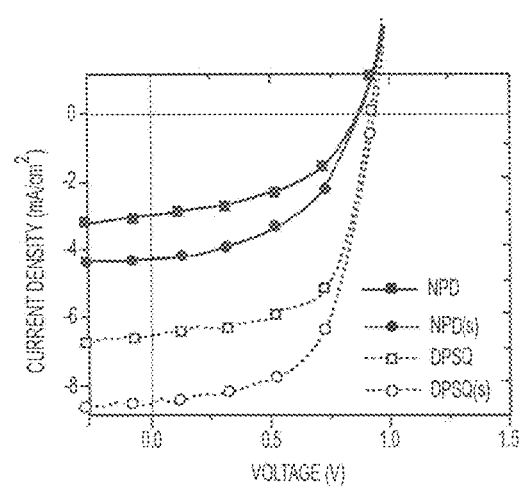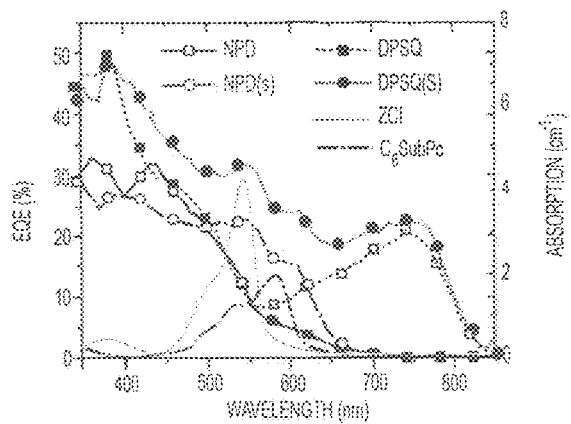
FIG. 26B

| DEVICE | $J_{sc}$ (mA/cm$^2$) | $V_{oc}$ (V) | FF | $\eta_p$(%) |
|---|---|---|---|---|
| NPD | 3.0 | 0.87 | 0.47 | 1.3 |
| NPD(s) | 4.3 | 0.87 | 0.49 | 1.8 |
| DPSQ | 6.5 | 0.92 | 0.63 | 3.8 |
| DPSQ(s) | 8.6 | 0.93 | 0.59 | 4.7 |

*FIG. 26C*

| DEVICE | $J_{SC}$ (mA/cm$^2$) | $V_{OC}$ (V) | FF | $\eta_P$ (%) |
|---|---|---|---|---|
| Sq | 6.2 | 0.68 | 0.49 | 2.1 |
| Sq:SubPc | 6.2 | 0.93 | 0.49 | 2.8 |

*FIG. 27C*

ENERGY SENSITIZATION OF ACCEPTORS AND DONORS IN ORGANIC PHOTOVOLTAICS

CROSS-REFERENCE TO RELATED APPLICATION

This application is a division of U.S. patent application Ser. No. 14/433,046, filed Apr. 2, 2015 (now U.S. Pat. No. 10,367,157), which is a national stage application under 35 U.S.C. § 371 of International Patent Application No. PCT/US2013/063661, filed Oct. 7, 2013, which claims the benefit of U.S. Provisional Application No. 61/710,504, filed Oct. 5, 2012; all of the above-identified applications are incorporated herein by reference in their entireties.

STATEMENT REGARDING FEDERALLY SPONSORED RESEARCH

This invention was made with U.S. Government support under Contract No. DE-SC0001013 awarded by the Department of Energy. The government has certain rights in the invention.

JOINT RESEARCH AGREEMENT

The subject matter of the present disclosure was made by, on behalf of, and/or in connection with one or more of the following parties to a joint university-corporation research agreement: University of Southern California and Global Photonic Energy Corporation. The agreement was in effect on and before the date the subject matter of the present disclosure was prepared, and was made as a result of activities undertaken within the scope of the agreement.

The present disclosure generally relates to electrically active, optically active, solar, and semiconductor devices and, in particular, to organic photosensitive optoelectronic devices comprising at least one acceptor and/or donor energy sensitizer. Also disclosed herein are methods of preparing the same.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m², AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF = \{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF*(I_{SC}*V_{OC})/P_{inc}$$

To produce internally generated electric fields that occupy a substantial volume of the semiconductor, the usual method is to juxtapose two layers of material (donor and acceptor) with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

The current-voltage characteristics of organic heterojunctions are often modeled using the generalized Shockley equation derived for inorganic diodes. However, since the Shockley equation does not rigorously apply to organic semiconductor donor-acceptor (D-A) heterojunctions (HJs), the extracted parameters lack a clear physical meaning.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction may also play an important role.

The energy level offset at an organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50$ Å) than the optical absorption length (~500 Å), requiring a tradeoff between using a thick, and therefore resistive, cell with multiple or highly folded interfaces, or a thin cell with a low optical absorption efficiency.

Organic PV cells have many potential advantages when compared to traditional silicon-based devices. Organic PV cells are light weight, economical in materials use, and can be deposited on low cost substrates, such as flexible plastic foils. The reported efficiencies of some of the best organic PVs are approaching 9%. For commercialization, however, device efficiencies must further improve via new material and device design approaches.

Thus, disclosed herein are organic photosensitive optoelectronic devices comprising acceptor and/or donor sensitizers to increase absorption and photoresponse of acceptor and/or donor layers, respectively.

In a first aspect, an organic photosensitive optoelectronic device comprises two electrodes in superposed relation; a mixed organic acceptor layer and an organic donor layer located between the two electrodes, wherein the mixed organic acceptor layer comprises a mixture of an acceptor material and at least one acceptor sensitizer, wherein the acceptor material and the at least one acceptor sensitizer are chosen to satisfy the following conditions:
the at least one acceptor sensitizer has a lowest triplet excited state ($E_{T-ASens}$) greater than or equal to a lowest triplet excited state energy ($E_{T-A}$) of the acceptor material;
the at least one acceptor sensitizer has a reduction potential lower than or equal to a reduction potential of the acceptor material; and
if the at least one acceptor sensitizer and the acceptor material form a charge transfer (CT) state having a CT state energy, the CT state energy is greater than or equal to the lowest triplet excited state energy ($E_{T-A}$) of the acceptor material.

In some embodiments of the first aspect, the acceptor material and the at least one acceptor sensitizer are chosen such that the at least one acceptor sensitizer has a lowest singlet excited state energy ($E_{T-ASens}$) greater than or equal to a lowest singlet excited state energy ($E_{S-A}$) of the acceptor material.

In some embodiments, the acceptor material and the at least one acceptor sensitizer are chosen such that the CT state energy is greater than or equal to a lowest singlet excited state energy ($E_{S-A}$) of the acceptor material.

In some embodiments, the mixture of the acceptor material and the at least one acceptor sensitizer form a solid solution.

In some embodiments, the at least one acceptor sensitizer has an absorptivity of at least $10^3$ cm$^{-1}$ at one or more wavelengths ranging from 350 to 950 nm.

In some embodiments, the at least one acceptor sensitizer has a maximum absorptivity at one or more wavelengths, the maximum absorptivity being at least twice as large as an absorptivity of the acceptor material at the one or more wavelengths.

In some embodiments, the acceptor material is chosen from fullerenes and fullerene derivatives.

In some embodiments, the at least one acceptor sensitizer is chosen from phthalocyanines, subphthalocyanines, dipyrrins and metal complexes thereof, porphyrins, azadipyrrins and metal complexes thereof, boron dipyrromethene (BODIPY) dyes, and derivatives thereof. In certain embodiments, the acceptor material is chosen from fullerenes and fullerene derivatives, and the at least one acceptor sensitizer is chosen from phthalocyanines, subphthalocyanines, dipyrrins and metal complexes thereof, porphyrins, azadipyrrins and metal complexes thereof, boron dipyrromethene (BODIPY) dyes, and derivatives thereof.

In some embodiments, the organic photosensitive optoelectronic device further comprises an intermediate acceptor layer located between the mixed acceptor layer and the donor layer, wherein the intermediate acceptor layer consists of the acceptor material and forms a donor-acceptor heterojunction with the donor layer.

In some embodiments, the at least one acceptor sensitizer comprises two or more sensitizers.

In some embodiments, the organic donor layer is a mixed organic donor layer comprising a mixture of a donor material and at least one donor sensitizer, wherein the donor material and the at least one donor sensitizer are chosen to satisfy the following conditions:
the at least one donor sensitizer has a lowest triplet excited state energy ($E_{T-DSens}$) greater than or equal to a lowest triplet excited state energy ($E_{T-D}$) of the donor material;
the at least one donor sensitizer has an oxidation potential higher than or equal to an oxidation potential of the donor material; and
if the at least one donor sensitizer and the donor material form a charge transfer (CT) state having a CT state energy, the CT state energy is greater than or equal to the lowest triplet excited state energy ($E_{T-D}$) of the donor material.

In some embodiments, the donor material and the at least one donor sensitizer are chosen such that the at least one donor sensitizer has a lowest singlet excited state energy ($E_{S-DSens}$) greater than or equal to a lowest singlet excited state energy ($E_{S-D}$) of the donor material.

In some embodiments, the donor material and the at least one donor sensitizer are chosen such that the CT state energy is greater than or equal to a lowest singlet excited state energy ($E_{S-D}$) of the donor material.

In some embodiments, the organic photosensitive optoelectronic device comprises an intermediate donor layer located between the mixed organic donor layer and the mixed organic acceptor layer, wherein the intermediate donor layer consists of the donor material and forms a donor-acceptor heterojunction with the mixed organic acceptor layer.

In some embodiments, the organic photosensitive optoelectronic device comprises an intermediate acceptor layer and an intermediate donor layer, wherein the intermediate acceptor layer consists of the acceptor material and is adjacent to the mixed organic acceptor layer, and the intermediate donor layer consists of the donor material and is adjacent to the mixed organic donor layer, both intermediate layers being positioned between the mixed organic acceptor layer and the mixed organic donor layer. In some embodiments, the intermediate acceptor layer and the intermediate donor layer form a donor-acceptor heterojunction.

In a second aspect, an organic photosensitive optoelectronic device comprises two electrodes in superposed relation; an organic acceptor layer and a mixed organic donor layer located between the two electrodes, wherein the mixed organic donor layer comprises a mixture of a donor material and at least one donor sensitizer, wherein the donor material and the at least one donor sensitizer are chosen to satisfy the following conditions:
the at least one donor sensitizer has a lowest triplet excited state energy ($E_{T-DSens}$) greater than or equal to a lowest triplet excited state energy ($E_{T-D}$) of the donor material;
the at least one donor sensitizer has an oxidation potential greater than or equal to an oxidation potential of the donor material; and if the at least one donor sensitizer and the donor material form a charge transfer (CT) state having a CT state energy, the CT state energy is greater than or equal to the lowest triplet excited state energy ($E_{T-D}$) of the donor material.

In some embodiments of the second aspect, the donor material and the at least one donor sensitizer are chosen such that the at least one donor sensitizer has a lowest singlet excited state energy ($E_{S-DSens}$) greater than or equal to a lowest singlet excited state energy ($E_{S-D}$) of the donor material.

In some embodiments, the donor material and the at least one donor sensitizer are chosen such that the CT state energy is greater than or equal to a lowest singlet excited state energy ($E_{S-D}$) of the donor material.

In some embodiments, the mixture of the donor material and the at least one donor sensitizer form a solid solution.

In some embodiments, the at least one donor sensitizer has an absorptivity of at least $10^3$ cm$^{-1}$ at one or more wavelengths ranging from 350 to 950 nm.

In some embodiments, the organic photosensitive optoelectronic device further comprises an intermediate donor layer located between the mixed donor layer and the acceptor layer, wherein the intermediate donor layer consists of the donor material and forms a donor-acceptor heterojunction with the acceptor layer.

Also disclosed herein is a method of fabricating an organic photosensitive optoelectronic device comprising depositing a photoactive region over a first electrode, and depositing a second electrode over the photoactive region, wherein the photoactive region comprises a mixed organic acceptor layer and an organic donor layer, wherein the mixed organic acceptor layer comprises a mixture of an acceptor material and at least one acceptor sensitizer, the acceptor material and the at least one acceptor sensitizer being chosen to satisfy the following conditions:
the at least one acceptor sensitizer has a lowest triplet excited state energy ($E_{T-ASens}$) greater than or equal to a lowest triplet excited state energy ($E_{T-A}$) of the acceptor material;
the at least one acceptor sensitizer has a reduction potential lower than or equal to a reduction potential of the acceptor material; and
if the at least one acceptor sensitizer and the acceptor material form a charge transfer (CT) state having a CT state energy, the CT state energy is greater than or equal to the lowest triplet excited state energy ($E_{T-A}$) of the acceptor material.

In some embodiments of the disclosed method, the deposition of a photoactive region over a first electrode comprises depositing the organic donor layer over the first electrode; and co-depositing the acceptor material and the at least one acceptor sensitizer over the first electrode, wherein the co-deposition over the first electrode occurs before or after the deposition of the organic donor layer over the first electrode.

In some embodiments, the acceptor material and the at least one acceptor sensitizer are co-deposited at an acceptor:sensitizer ratio in the range of 10:1 to 1:2.

In some embodiments, the photoactive region further comprises an intermediate acceptor layer located between the mixed organic acceptor layer and the organic donor layer, wherein the intermediate acceptor layer consists of the acceptor material. In those embodiments, the deposition of a photoactive region over a first electrode may comprise depositing the organic donor layer over the first electrode; depositing the intermediate acceptor layer over the first electrode; and co-depositing the acceptor material and the at least one acceptor sensitizer over the first electrode, wherein the co-deposition over the first electrode occurs before or after the deposition of the organic donor layer, and wherein the deposition of the intermediate acceptor layer results in the intermediate acceptor layer being positioned between the mixed organic acceptor layer and the organic donor layer.

In some embodiments of the disclosed method, the organic donor layer is a mixed organic donor layer as described herein. In those embodiments, the deposition of a photoactive region over a first electrode may comprise co-depositing the donor material and the at least one donor sensitizer over the first electrode, and co-depositing the acceptor material and the at least one acceptor sensitizer over the first electrode, wherein the co-deposition of the acceptor material and the at least one acceptor sensitizer occurs before or after the co-deposition of the donor material and the at least one donor sensitizer. In certain embodiments, the acceptor material and the at least one acceptor sensitizer are co-deposited at an acceptor:sensitizer ratio in a range of 10:1 to 1:2, and the donor material and the at least one donor sensitizer are co-deposited at a donor:sensitizer ratio in a range of 10:1 to 1:2.

In some embodiments, the photoactive region further comprises an intermediate acceptor layer and an intermediate donor layer, wherein the intermediate acceptor layer consists of the acceptor material and is adjacent to the mixed organic acceptor layer, and the intermediate donor layer consists of the donor material and is adjacent to the mixed organic donor layer, both intermediate layers being positioned between the mixed organic donor layer and the mixed organic acceptor layer. The intermediate acceptor layer and the intermediate donor layer may form a donor-acceptor heterojunction. The deposition of a photoactive region over a first electrode may comprise co-depositing the donor material and the at least one donor sensitizer over the first electrode; depositing the intermediate donor material over the first electrode; depositing the intermediate acceptor material over the first electrode; and co-depositing the acceptor material and the at least one acceptor sensitizer over the first electrode, wherein the co-deposition of the acceptor material and the at least one acceptor sensitizer occurs before or after the co-deposition of the donor material and the at least one donor sensitizer, and wherein the deposition of the intermediate acceptor layer results in the intermediate acceptor layer being positioned adjacent the mixed organic acceptor layer, and the deposition of the intermediate donor layer results in the intermediate donor layer being positioned adjacent the mixed organic donor layer, both intermediate layers being positioned between the mixed organic donor layer and the mixed organic acceptor layer.

The accompanying figures are incorporated in, and constitute a part of this specification.

FIG. 1 shows a schematic of an organic photosensitive optoelectronic device comprising an organic mixed acceptor layer in accordance with the present disclosure.

FIG. 2 shows energy sensitization pathways following excitation of a sensitizer using $C_{60}$ as an exemplary acceptor material, where FIG. 2A shows Forster (singlet-singlet) energy transfer; FIG. 2B shows Dexter (triplet-triplet) energy transfer; and FIG. 2C shows electron transfer via a charge transfer state. Abbreviations: energy transfer (EnT), intersystem crossing (ISC), electron transfer (EIT), charge transfer (CT).

Figure 11A:
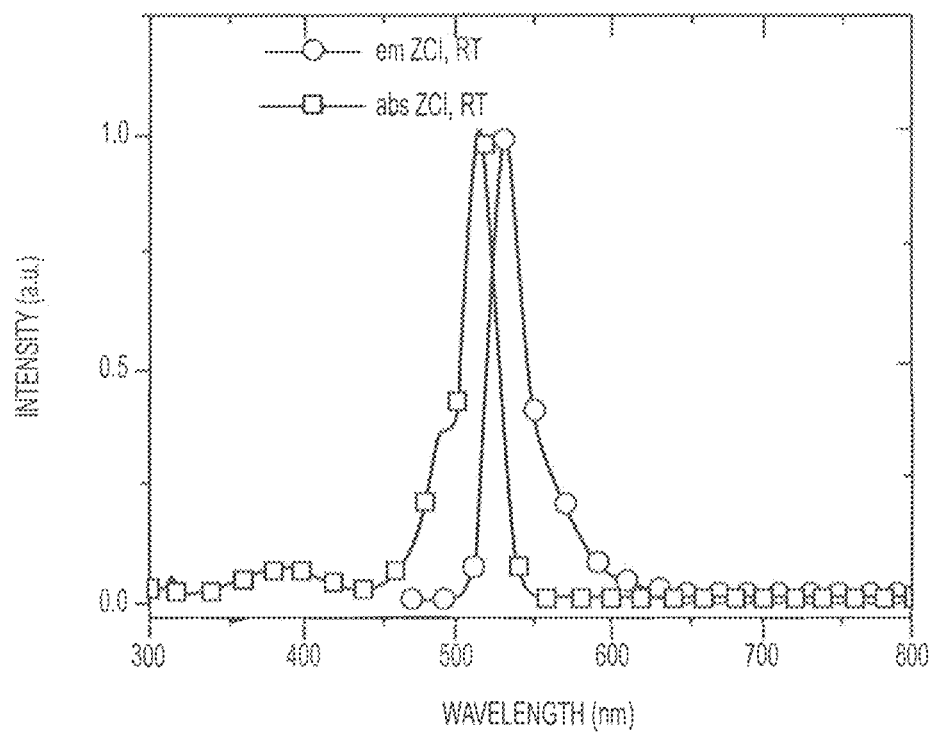
Figure 11B:
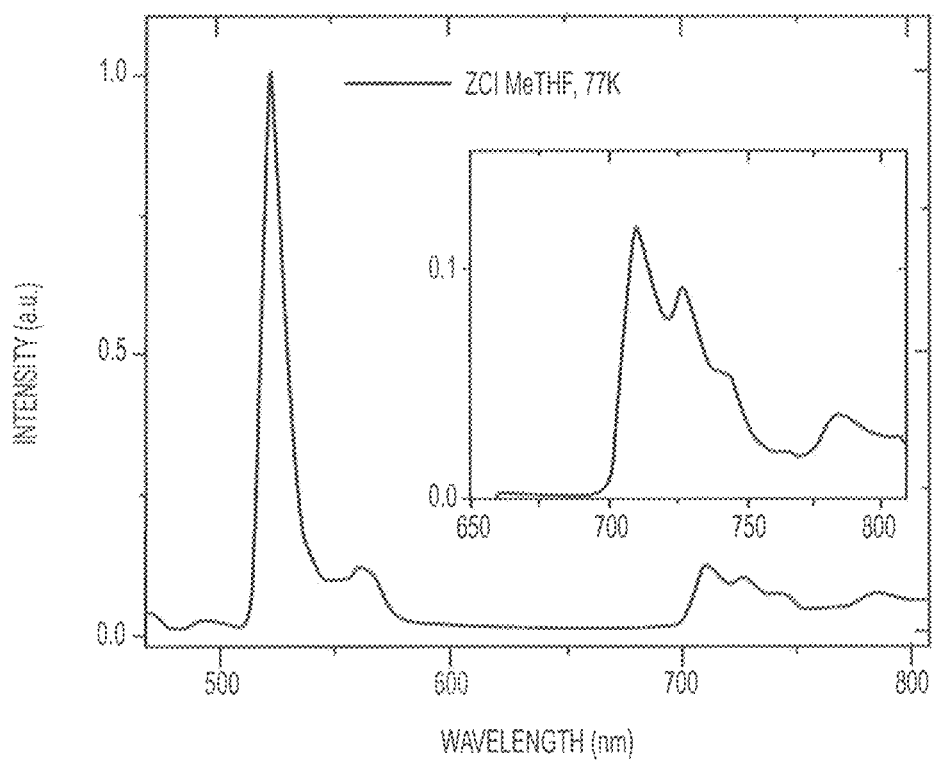
Figure 11C:
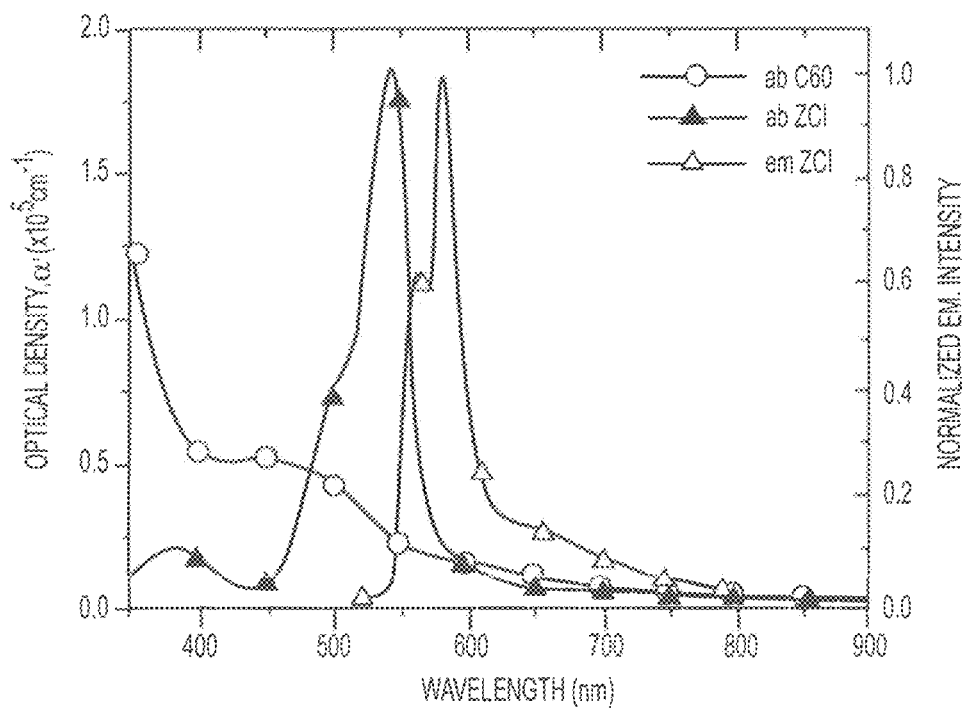
Figure 11D:
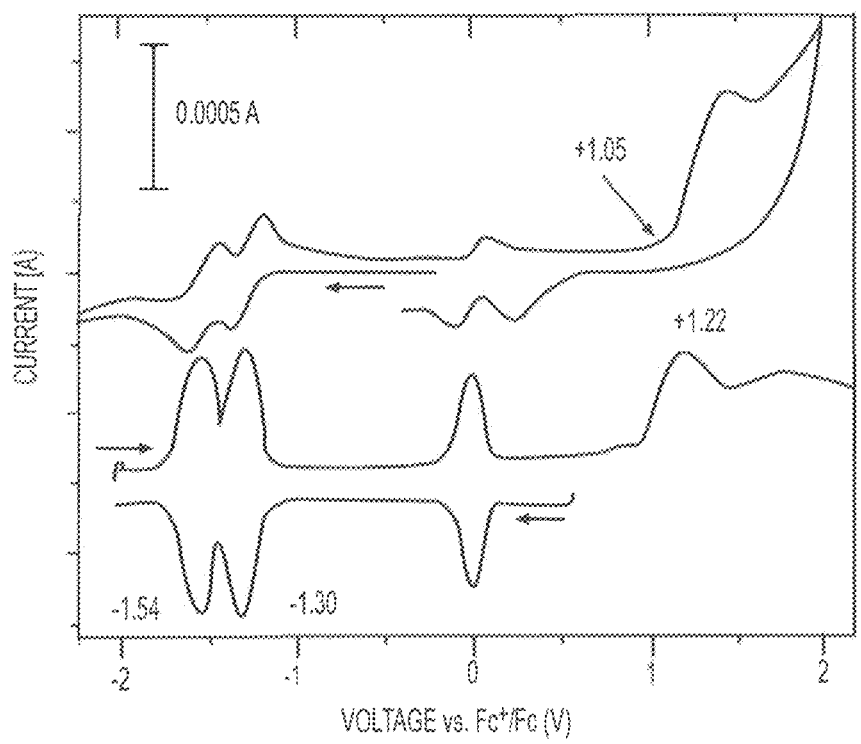

FIG. 11A shows absorption (solid square) and emission (open circle) spectra of ZCl in methyl cyclohexane at room temperature; FIG. 11B shows an emission spectrum of ZCl in 2-methyl tetrahydrofuran at 77K (inset is emission from the triplet state of ZCl); FIG. 11C shows absorption (solid symbols) and emission (open symbol) under excitation at 500 nm of $C_{60}$ film (square) and ZCl film (triangle); and FIG. 11D shows cyclic voltammetry (CV) and differential pulse voltammetry (DPV) diagrams of ZCl in dichloromethane (vs. $Fc^+/Fc$) (scan rate at 100 mV/s).

Figure 12:
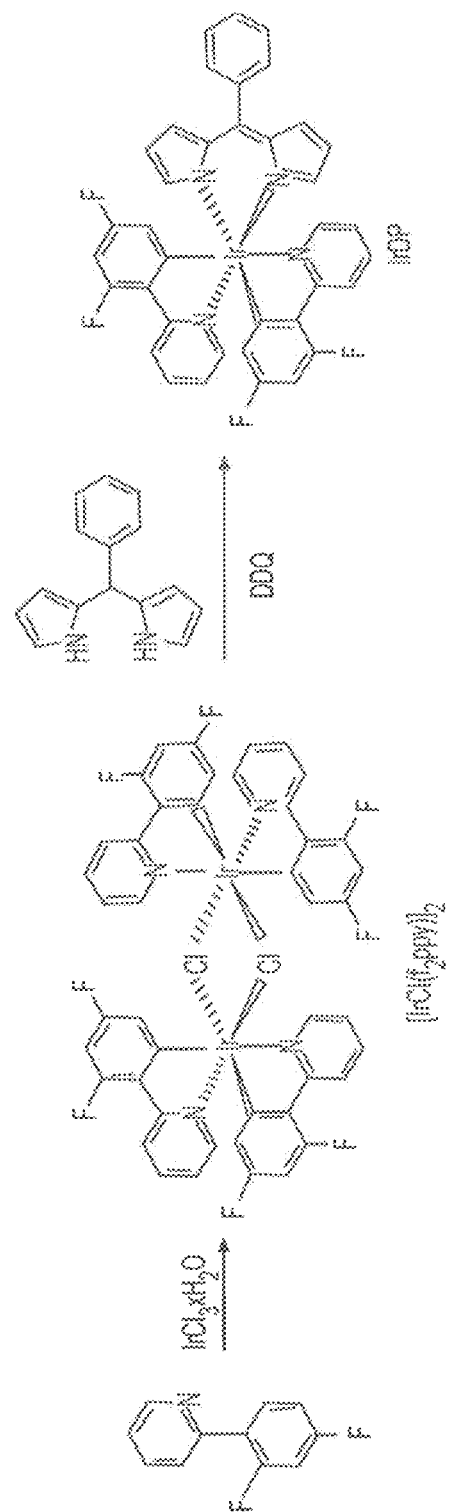

FIG. 12 shows a synthesis and structure of an iridium dipyrrin compound (IrDP).

Figure 13A:
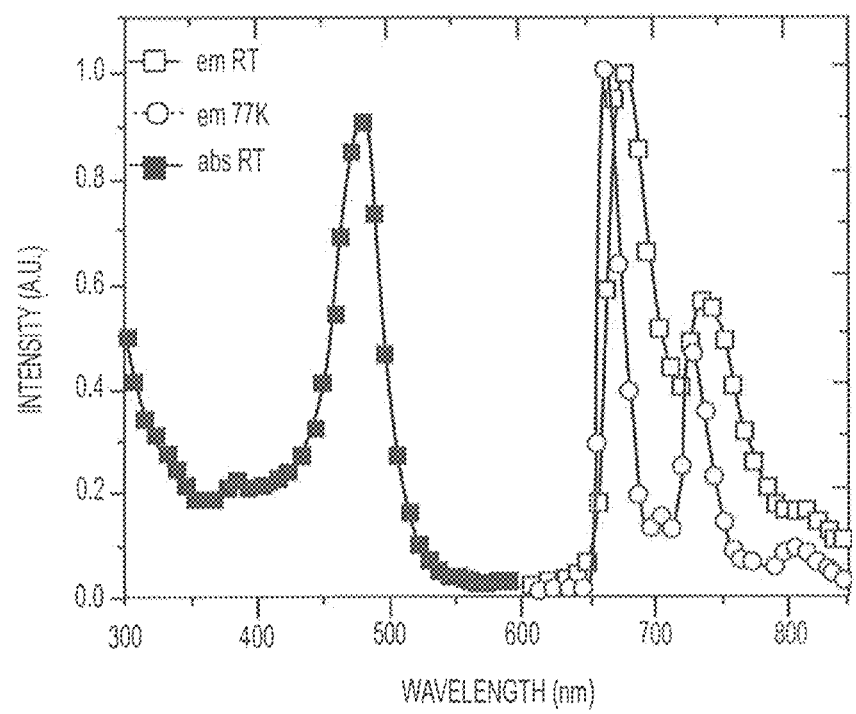
Figure 13B:
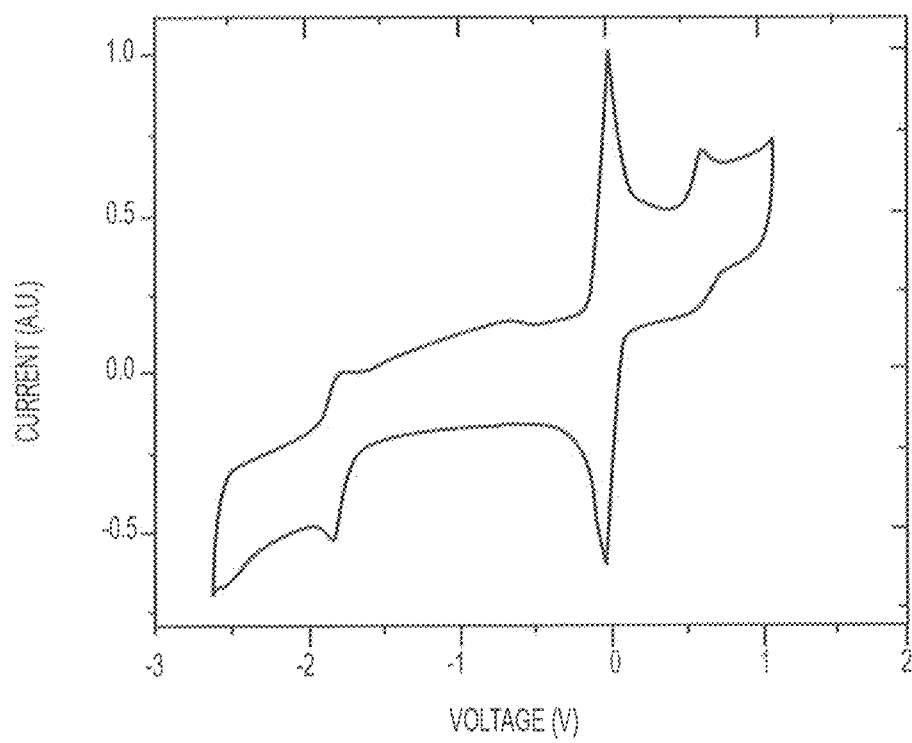
Figure 13C:
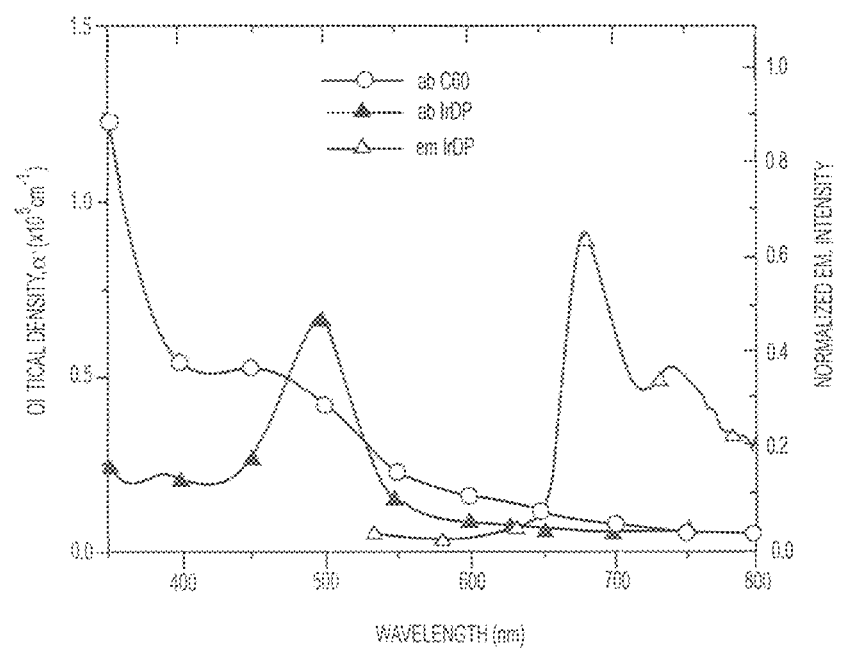

FIG. 13A shows absorption (solid symbol) and emission (open symbol) of IrDP in dichloromethane solution under N2 at room temperature (square) and at 77K (circle); FIG. 13B shows a cyclic voltammetry diagram for IrDP (scan rate at 100 mV/s); and FIG. 13C shows absorption (solid symbols) of a $C_{60}$ film (square) and an IrDP film (triangle) and emission (open symbol) of IrDP under excitation at 500 nm.

Figure 14A:
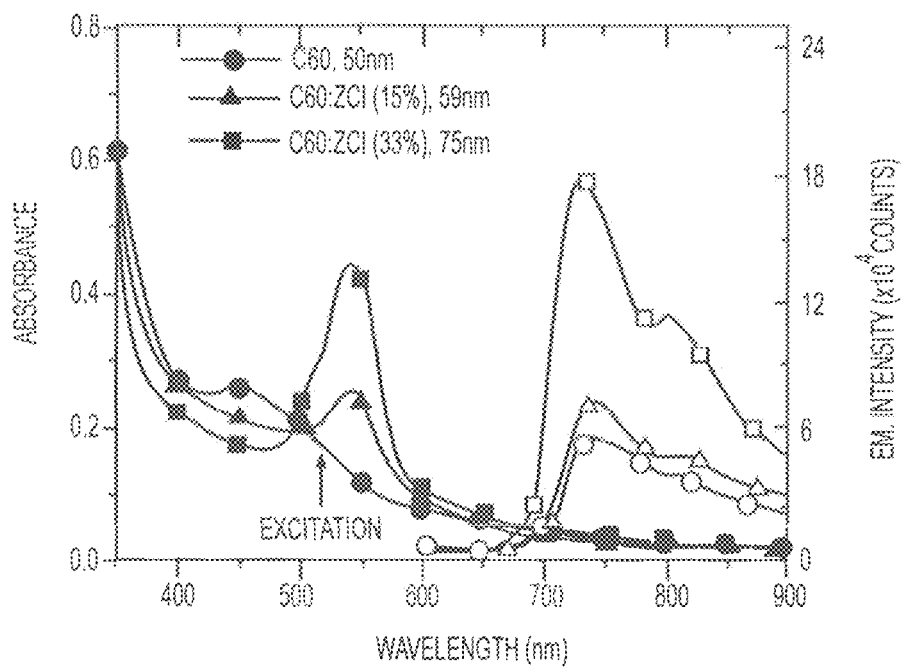
Figure 14B:
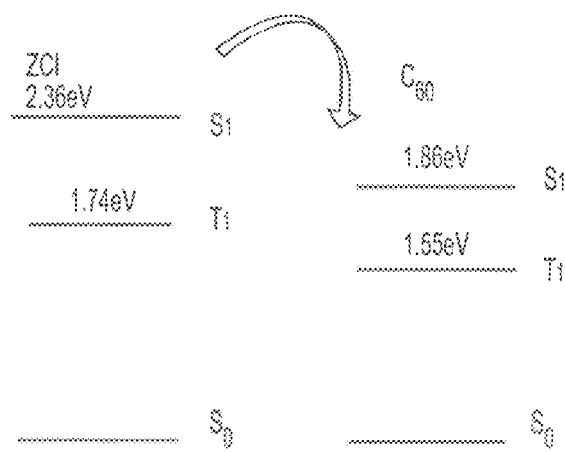

FIG. 14A shows absorption (solid symbols) and emission (open symbols) under laser excitation at 517 nm of 50 nm $C_{60}$ (circle), 50 nm of $C_{60}$ mixed with 9 nm of ZCl (15% v/v) (triangle) and 50 nm of $C_{60}$ mixed with 25 nm of ZCl (33% v/v) (square) and FIG. 14B depicts Forster energy transfer from ZCl to $C_{60}$.

Figure 15:
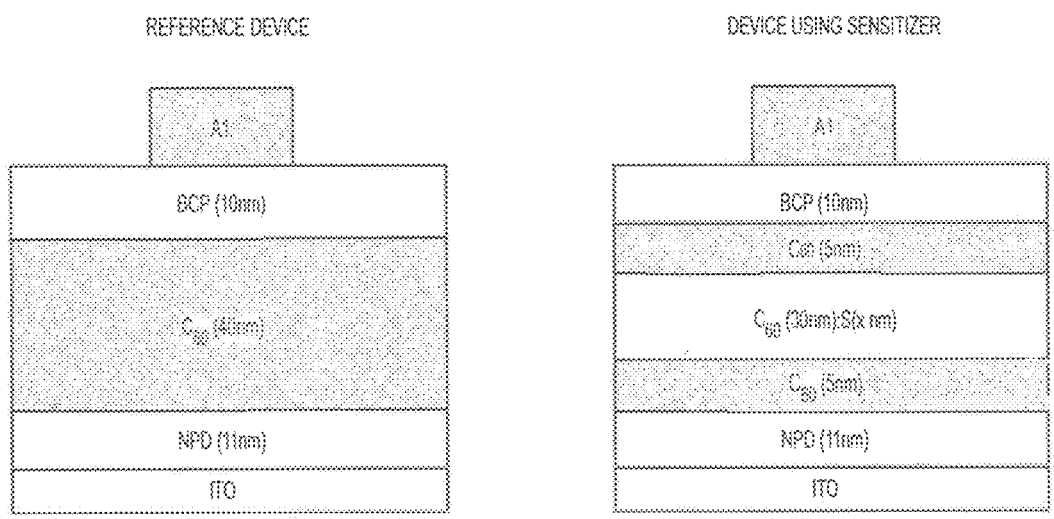

FIG. 15 shows a schematic of a reference device and a device using an acceptor sensitizer at varying amounts.

Figure 16A:
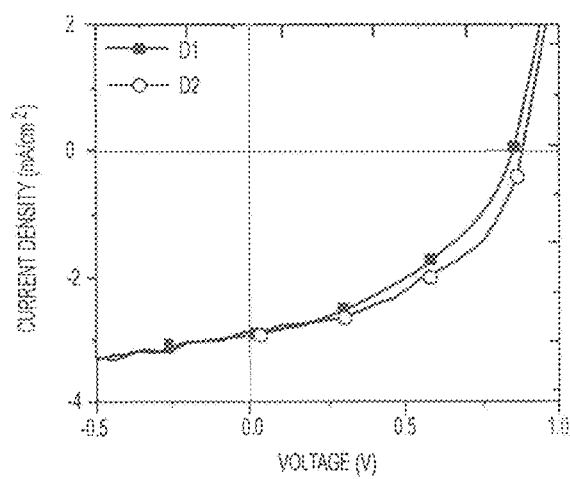
Figure 16B:
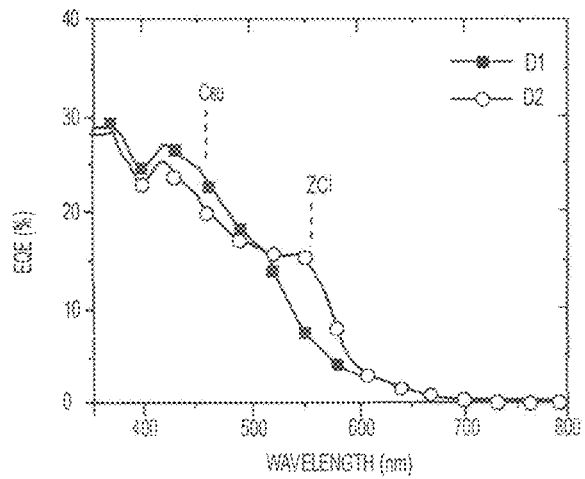

FIG. 16 shows performance characteristics of an organic PV device using ZCl as a sensitizer, where FIG. 16A shows current-voltage characteristics under 1 sun AM 1.5 G illumination and FIG. 16B shows external quantum efficiency (EQE) measurements of reference device D1 and the sensitized device (D2) ($C_{60}$:ZCl at 30 nm:6 nm, 17% v/v).

Figure 17A:
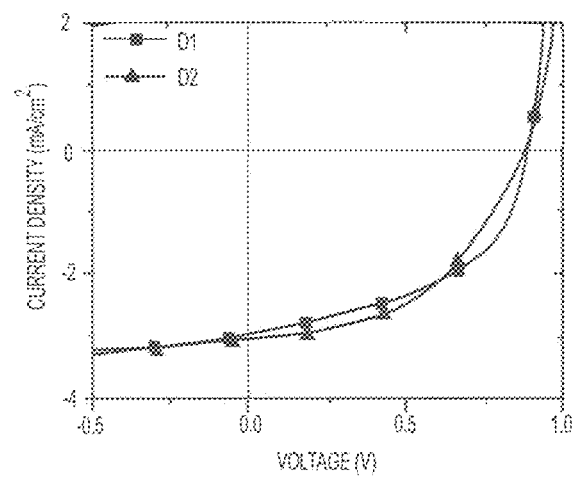
Figure 17B:
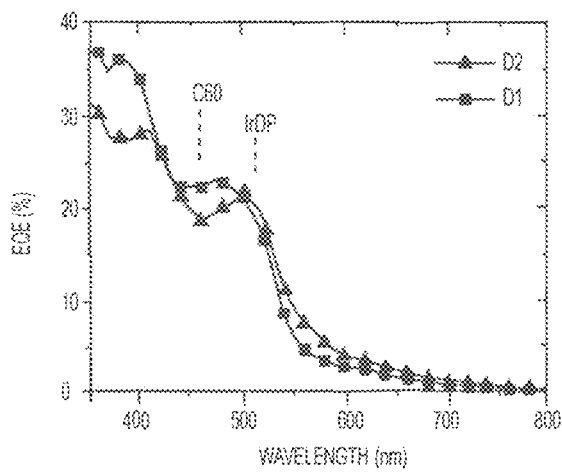

FIG. 17 shows performance characteristics of an organic PV device using IrDP as a sensitizer, where FIG. 17A shows current-voltage characteristics under 1 sun AM 1.5 G illumination and FIG. 17B shows external quantum efficiency (EQE) measurements of reference device D1 and the sensitized device (D2) ($C_{60}$:IrDP at 30 nm:6 nm, 17% v/v).

Figure 18A:
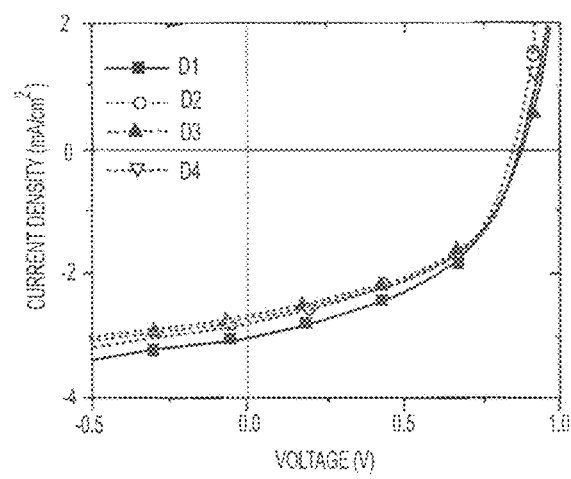
Figure 18B:
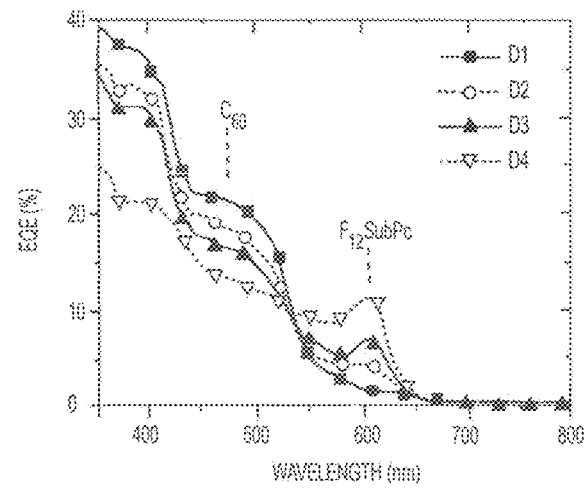

FIG. 18 shows performance characteristics of an organic PV device using $F_{12}SubPc$ as a sensitizer, where FIG. 18A shows current-voltage characteristics under 1 sun AM 1.5 G illumination and FIG. 18B shows external quantum efficiency (EQE) measurements of reference device D1 and sensitized devices (D2-$C_{60}$:$F_{12}SubPc$ at 30 nm:3 nm, 9% v/v), (D3-$C_{60}$:$F_{12}SubPc$ at 30 nm:6 nm, 17% v/v), and (D4-$C_{60}$:$F_{12}SubPc$ at 30 nm:12 nm, 29% v/v).

FIG. 19 shows performance characteristics of an organic PV device using $Cl_6SubPc$ as a sensitizer, where FIG. 19A shows current-voltage characteristics under 1 sun AM 1.5 G illumination and FIG. 19B shows external quantum efficiency (EQE) measurements of reference device D1 and the sensitized device (D2) ($C_{60}$:$Cl_6SubPc$ at 30 nm:6 nm, 17% v/v).

FIG. 20 summarizes the performance characteristics of the organic PV devices using different sensitizers: ITO/NPD (11 nm)/$C_{60}$ (5 nm)/ S:$C_{60}$ (t nm:30 nm, x %, v/v)/$C_{60}$ (5 nm)/BCP (10 nm)/Al, and the corresponding reference devices, ITO/NPD (11 nm)/$C_{60}$ (40 nm)/BCP (10 nm)/Al under simulated 1 sun AM1.5 G illumination.

Figure 21A:
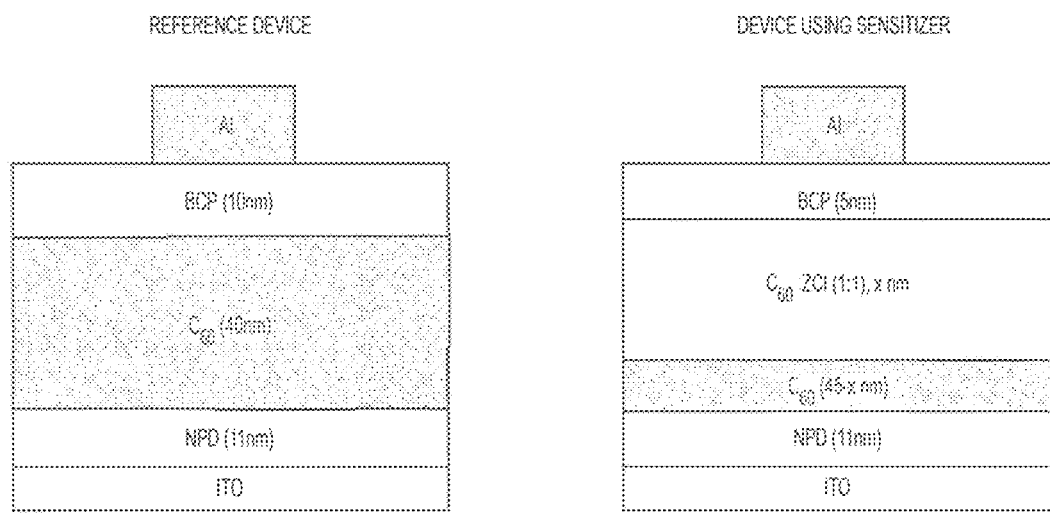
Figure 21B:
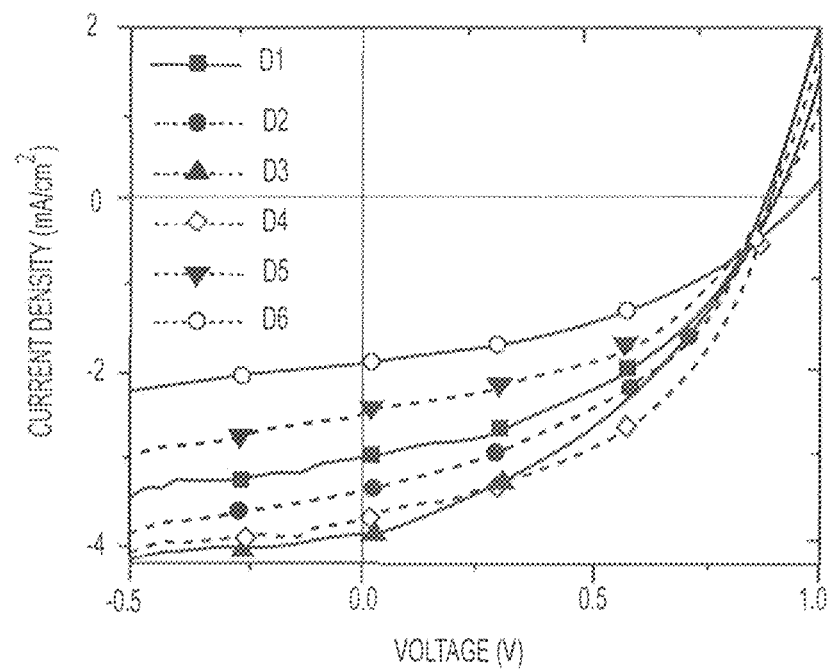
Figure 21C:
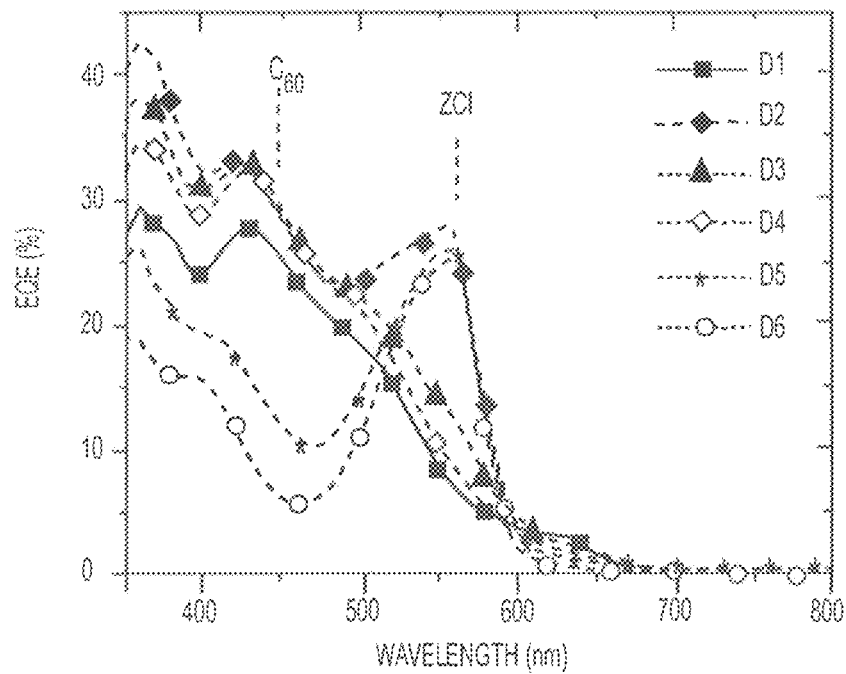

FIG. 21A shows a schematic of a reference device and a schematic of a device with a mixed $C_{60}$:ZCl layer on top of a neat $C_{60}$ layer, the layers having various thicknesses; FIG. 21B shows current-voltage characteristics for the devices under 1 sun AM1.5 G illumination; and FIG. 21C shows EQE measurements of the reference device (D1) and the sensitized devices ($C_{60}$:ZCl at 1:1 by volume) with various thicknesses: D2 (x=10 nm), D3 (x=20 nm), D4 (x=30 nm), D5 (x=40 nm) and D6 (x=45 nm).

FIG. 22A shows an optimization of the thickness of a mixed $C_{60}$:ZCl layer in a device using a 15 nm thick neat $C_{60}$ layer at the D/A interface; FIG. 22B shows an optimization of the thickness of a mixed $C_{60}$:ZCl layer in a device using a 25 nm thick neat $C_{60}$ layer at the D/A interface (t=0 nm is the reference device with 40 nm of neat $C_{60}$); and FIG. 22C summarizes the performance characteristics of devices having either a 15 nm or a 25 nm thick neat $C_{60}$ layer with varying mixed $C_{60}$:ZCl layer thicknesses.

Figure 23A:
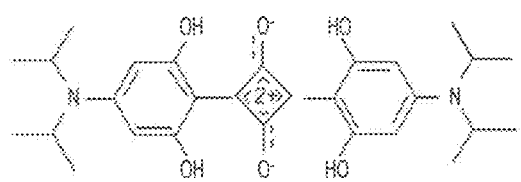
Figure 23B:
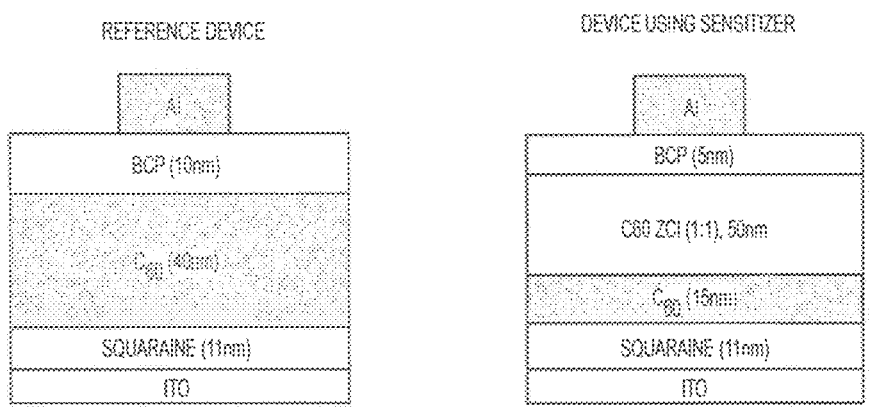
Figure 23C:
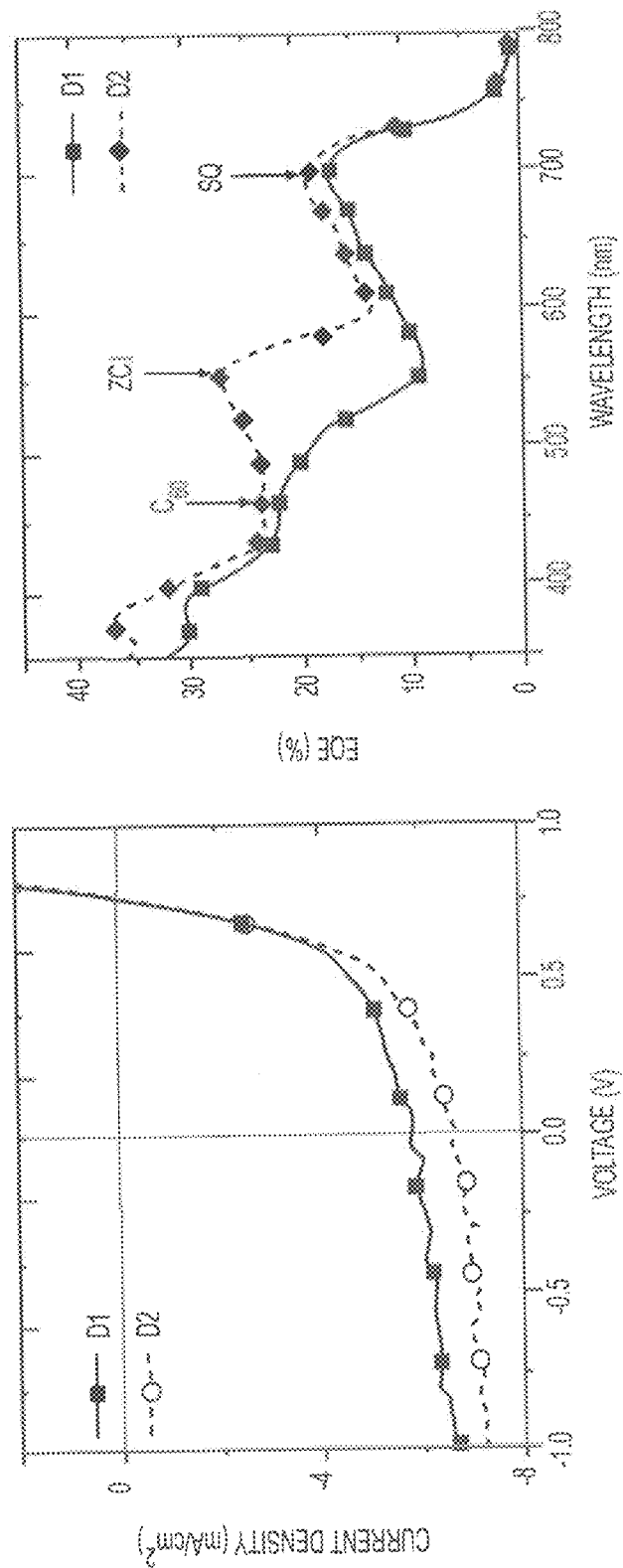

FIG. 23A shows the structure of squaraine (SQ) used as a donor layer; FIG. 23B shows a schematic of a reference device and a schematic of a device with a mixed $C_{60}$:ZCl layer and a squaraine (SQ) donor layer; FIG. 23C shows current-voltage characteristics under 1 sun AM1.5 G illumination and EQE measurements; FIG. 23D summarizes the performance characteristics of the devices. (D2: ITO/SQ (11 nm)/$C_{60}$ (15 nm)/ZCl:$C_{60}$ (1:1, 50 nm)/BCP (10 nm)/Al) and (D1, reference device: ITO/SQ (11 nm)/$C_{60}$ (40 nm)/BCP (10 nm)/Al).

Figure 24A:
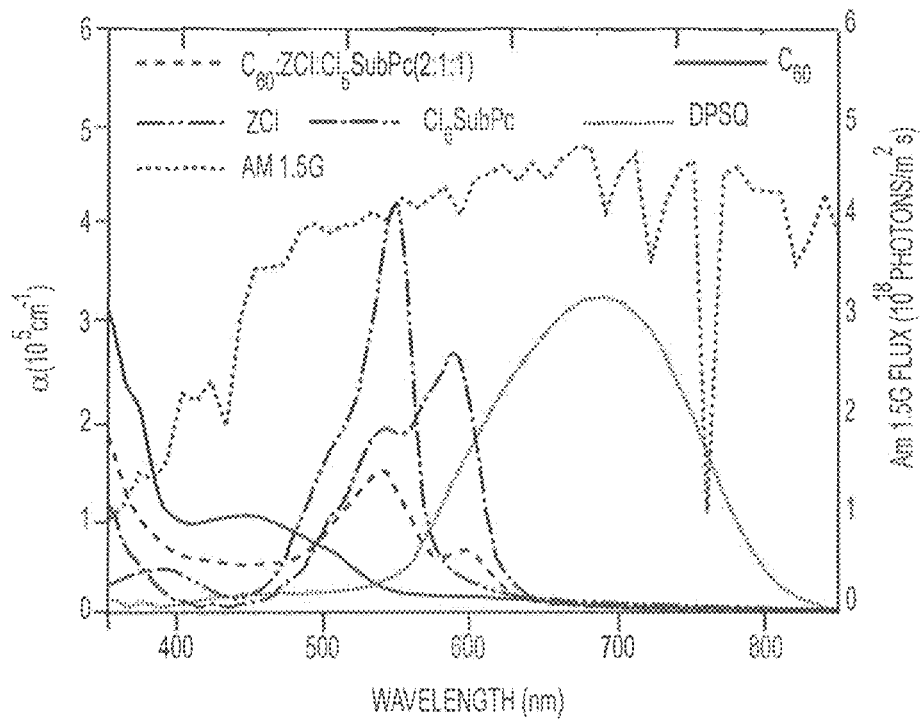
Figure 24B:
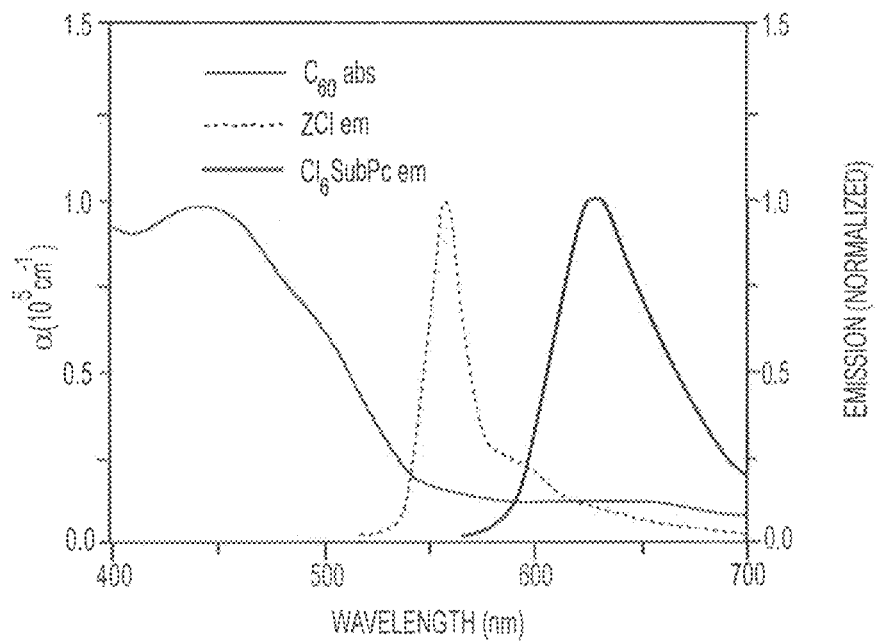

FIG. 24A shows thin film extinction coefficients of $C_{60}$, ZCl, $Cl_6SubPc$, $C_{60}$:ZCl:$Cl_6SubPc$, and DPSQ compared with the AM 1.5 G solar spectrum; and FIG. 24B show emission spectra of ZCl and $Cl_6SubPc$ compared with the absorption of $C_{60}$.

Figure 25:
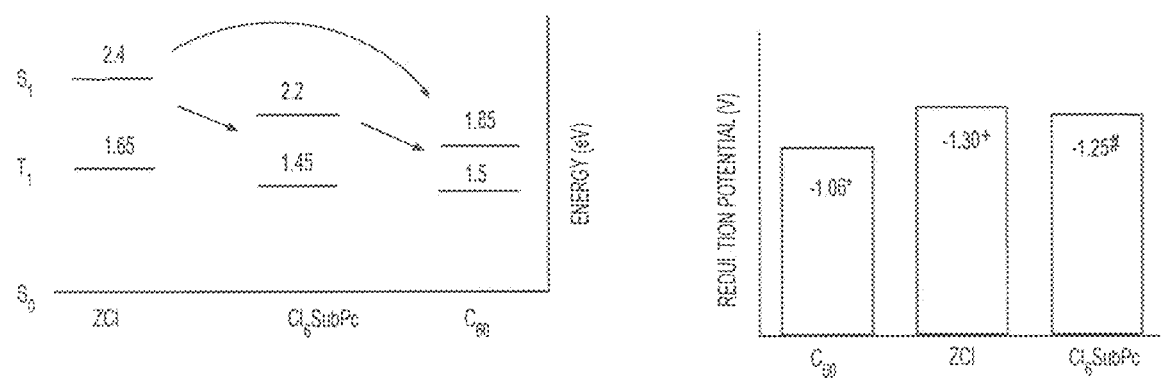

FIG. 25 shows singlet and triplet energies of ZCl, $Cl_6SubPc$, and $C_{60}$ with arrows indicating energy transfer pathways and reduction potentials (vs $Fc/Fc^+$) of $C_{60}$, ZCl, and $Cl_6SubPc$.

Figure 26A:
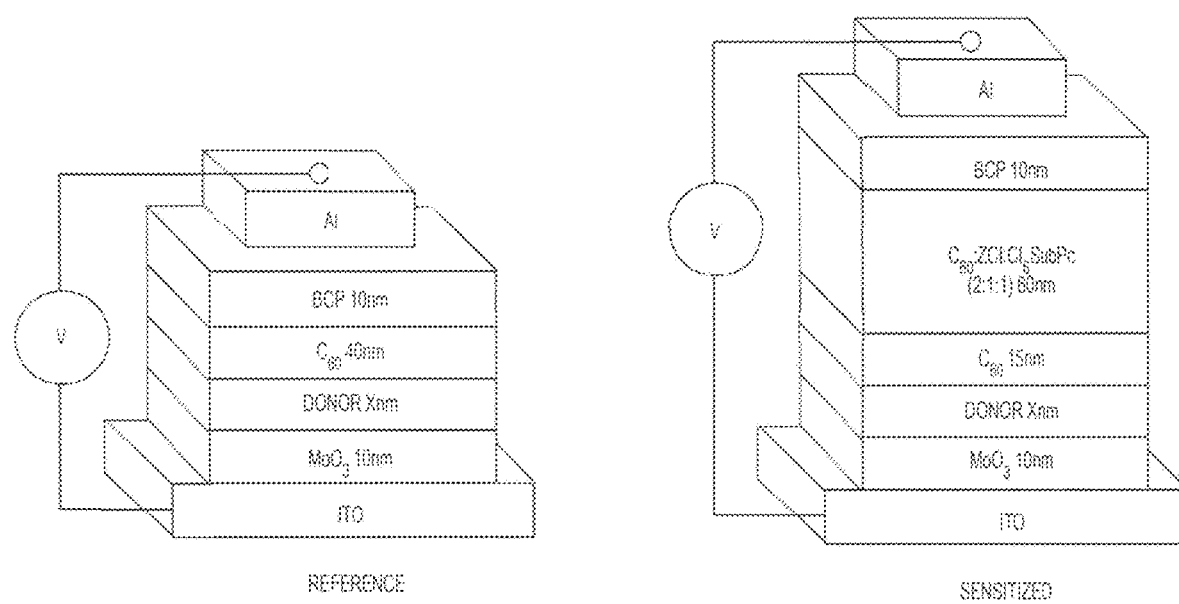

FIG. 26A shows a schematic of a reference device and a device utilizing multiple sensitizers; FIG. 26B shows J-V curves of devices under one sun AM1.5 G illumination and EQE measurements with absorption spectra of ZCl and $Cl_6SubPc$ added for reference; and FIG. 26C summarizes the performance characteristics of the devices.

Figure 27A:
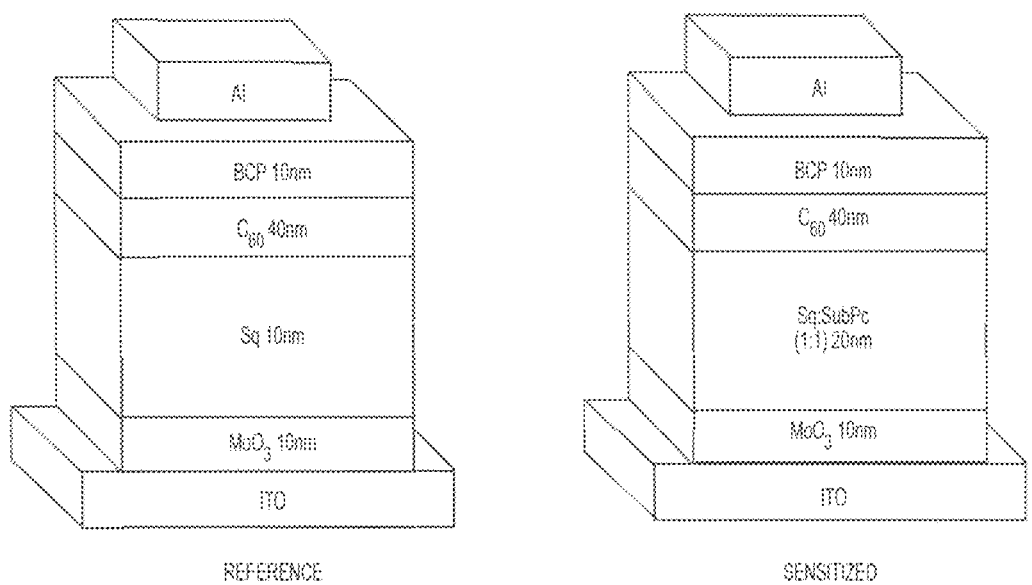
Figure 27B:
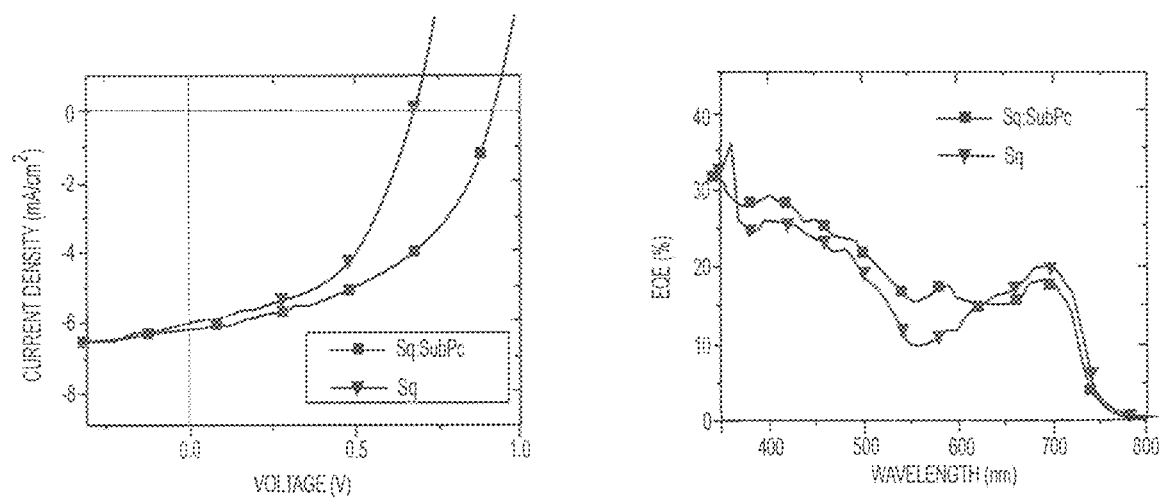

FIG. 27A shows a schematic of a reference device and a device utilizing a donor sensitizer; FIG. 27B shows J-V curves of devices under one sun AM1.5 G illumination and EQE measurements; and FIG. 27C summarizes the performance characteristics of the devices.

As used herein, the term "organic" includes polymeric materials as well as small molecule organic materials that may be used to fabricate organic photosensitive devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone.

As used herein, "lowest triplet excited state energy" means the triplet excited state energy closest to the ground state energy.

As used herein, "lowest singlet excited state energy" means the singlet excited state energy closest to the ground state energy.

As used herein, the term "co-depositing" or "co-deposition" means a process of depositing materials to produce a solid solution. Materials may be "co-deposited" according to a variety of methods. "Co-depositing" or "co-deposition" may include, for example, simultaneously or sequentially depositing materials independently (from separate sources) onto a substrate, where the ratio of the materials can be controlled by the rate of deposition of each material. Vapor deposition methods are examples of this approach. Alternatively, "co-depositing" or "co-deposition" may include mixing the materials at a desired ratio and depositing the mixed materials onto a substrate. Fluid solution deposition methods are examples of this alternative approach.

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the ambient electromagnetic radiation in relevant wavelengths to be transmitted through it. An electrode is said to be "semi-transparent" when it permits some, but less that 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, the expression that a material or component is deposited "over" another material or component permits other materials or layers to exist between the material or component being deposited and the material or component "over" which it is deposited. For example, a layer may be described as being deposited "over" an electrode, even though there are various materials or layers in between the layer and the electrode.

As used herein, the term "absorptivity" refers to the percentage of incident light at a given wavelength that is absorbed.

For the present disclosure, molecular energies within 0.1 eV of one another are considered to be "equal."

The organic photosensitive optoelectronic devices of the present disclosure comprise at least one acceptor and/or donor sensitizer to improve the absorption and photoresponse of the acceptor and/or donor layers, respectively. The sensitizers are designed such that energy absorbed by a sensitizer may be transferred to a host acceptor or host donor material, the acceptor and donor materials being responsible for exciton transport, charge separation, and charge carrier conduction.

Figure 1:
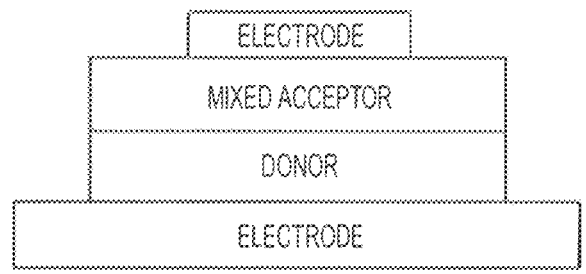

In one embodiment, an organic acceptor material of a photosensitive optoelectronic device may be mixed with an acceptor sensitizer to form a mixed organic acceptor layer. For example, as shown in FIG. 1, the device comprises two electrodes in superposed relation with a mixed organic acceptor layer and an organic donor layer located between the two electrodes.

The organic donor layer comprises at least one donor material. The mixed organic acceptor layer comprises a mixture of an acceptor material and at least one acceptor sensitizer. The mixed organic acceptor layer and the donor layer comprise the device's photoactive region, which absorbs electromagnetic radiation to generate excitons that may dissociate into an electron and a hole in order to generate an electrical current. The interface between the mixed organic acceptor layer and the donor layer may form a donor-acceptor heterojunction.

Absorption bands of the acceptor material and the at least one acceptor sensitizer may complement one another to expand the overall absorption of the mixed organic acceptor layer. That is, to optimize absorption, in some embodiments, the acceptor material and the acceptor sensitizer(s) can be chosen such that they do not exhibit substantially similar absorptivity over the same wavelengths. In some embodiments, the at least one acceptor sensitizer has a maximum absorptivity at one or more wavelengths, wherein the maximum absorptivity is at least twice as large as the absorptivity of the acceptor material at the one or more wavelengths. In some embodiments, the at least one acceptor sensitizer has an absorptivity of at least $10^3$ cm$^{-1}$ at one or more wavelengths ranging from 350 to 950 nm. In some embodiments, the at least one acceptor sensitizer has an absorptivity of at least $10^3$ cm$^{-1}$ at one or more wavelengths ranging from 450 to 700 nm.

An important feature of the present disclosure is efficient transfer of absorbed energy from the at least one acceptor sensitizer to the acceptor material. Thus, the at least one acceptor sensitizer and the acceptor material should be chosen to satisfy the following conditions:

the at least one acceptor sensitizer has a lowest triplet excited state energy ($E_{T\text{-}ASens}$) greater than or equal to a lowest triplet excited state energy ($E_{T\text{-}A}$) of the acceptor material;

the at least one acceptor sensitizer has a reduction potential lower than or equal to a reduction potential of the acceptor material; and if the at least one acceptor sensitizer and the acceptor material form a charge transfer (CT) state having a CT state energy, the CT state energy is greater than or equal to the lowest triplet excited state energy ($E_{T\text{-}A}$) of the acceptor material.

Figure 2:
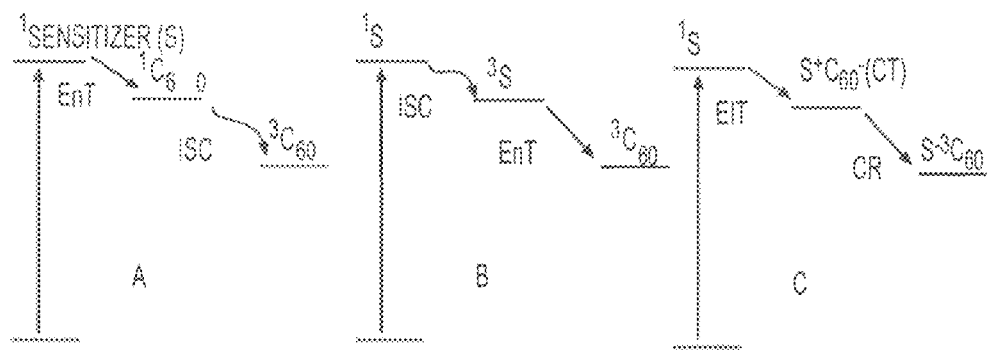

The at least one acceptor sensitizer having a lowest triplet excited state energy ($E_{T\text{-}ASens}$) greater than or equal to the lowest triplet excited state energy ($E_{T\text{-}A}$) of the acceptor material permits Dexter (triplet-triplet) energy transfer between the at least one acceptor sensitizer and the acceptor material. This mechanism is shown in FIG. 2B using a $C_{60}$ acceptor as an example. If the at least one acceptor sensitizer and the acceptor material form a CT state, a CT state energy greater than or equal to the lowest triplet excited state energy ($E_{T\text{-}A}$) of the acceptor material permits electron transfer to the acceptor material, as shown in FIG. 2C using $C_{60}$ as an example. The at least one acceptor sensitizer having a reduction potential lower than or equal to the reduction potential of the acceptor material allows for efficient energy transfer by preventing charge separation and/or carrier trapping.

The acceptor material and the at least one acceptor sensitizer may also be chosen such that the at least one acceptor sensitizer has a lowest singlet excited state energy ($E_{S\text{-}ASens}$) greater than or equal to a lowest singlet excited state energy ($E_{S\text{-}A}$) of the acceptor material. This arrangement permits Forster (singlet-singlet) energy transfer between the at least one acceptor sensitizer and the acceptor material, as shown in FIG. 2A using $C_{60}$ as an example.

The acceptor material and the at least one acceptor sensitizer may also be chosen such that the CT state energy, if formed, is greater than or equal to a lowest singlet excited state energy ($E_{S\text{-}A}$) of the acceptor material.

The size and shape of the at least one acceptor sensitizer may substantially match the size and shape of the acceptor material. In some embodiments, the mixture of the acceptor material and the at least one acceptor sensitizer form a solid solution. As used herein, the term "solid solution" means an intimate and random mixture of two or more materials that is a solid at a given temperature, and that has no positional order for any of the components within the solid solution.

Examples of suitable acceptor materials for the present disclosure include but are not limited to polymeric or non-polymeric perylenes, polymeric or non-polymeric naphthalenes, and polymeric or non-polymeric fullerenes and fullerene derivatives (e.g., PCBMs, ICBA, ICMA, etc.). Non-limiting mention is made to those chosen from $C_{60}$, $C_{70}$, $C_{76}$, $C_{82}$, $C_{84}$, 3,4,9,10-perylenetetracarboxylicbis-benzimidazole (PTCBI), Phenyl-$C_{61}$-Butyric-Acid-Methyl Ester ([60]PCBM), Phenyl-$C_{71}$-Butyric-Acid-Methyl Ester ([70]PCBM), Thienyl-$C_{61}$-Butyric-Acid-Methyl Ester ([60]ThCBM), and hexadecafluorophthalocyanine ($F_{16}CuPc$).

The at least one acceptor sensitizer of the present disclosure may be chosen from, for example, phthalocyanines, subphthalocyanines, dipyrrins and metal complexes thereof, porphyrins, azadipyrrins and metal complexes thereof, boron dipyrromethene (BODIPY) dyes, and derivatives thereof. It should be appreciated that absorption, singlet and triplet energies, and reduction/oxidation potential of candidate materials for the at least one acceptor sensitizer may be tuned by attaching functional groups. For example, functional groups may be attached to extend the π-conjugation of dipyrrins, azadipyrrins, porphyrins, phthalocyanines, and subphthalocyanines.

In some embodiments, the at least one acceptor sensitizer is a compound having a structure

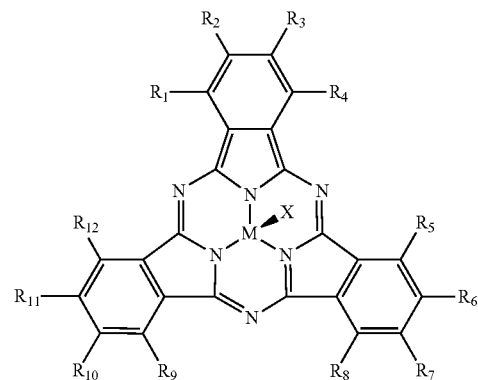

wherein M is chosen from B, Al, Ga, In, and Tl; X is chosen from halogens, —SCN, alkyl, aryl, —OR, and —SR; and $R_{1\text{-}12}$ are independently chosen from H and inorganic and organic functional groups such that the conditions for the acceptor material and the at least one acceptor sensitizer are satisfied. In certain embodiments, $R_{1\text{-}12}$ are independently chosen from —NO$_2$, halogens, —CN, —SCN, alkyl, aryl, —OR, —SR, —COOR, —CRO, and H.

In some embodiments, the at least one acceptor sensitizer is a compound chosen from

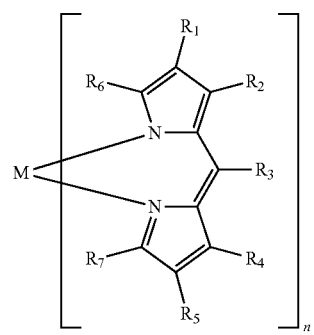

3
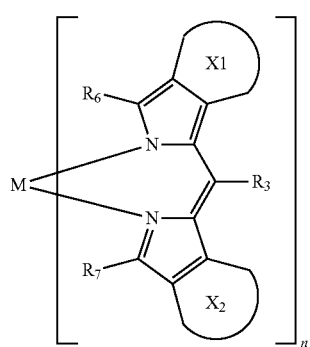
4
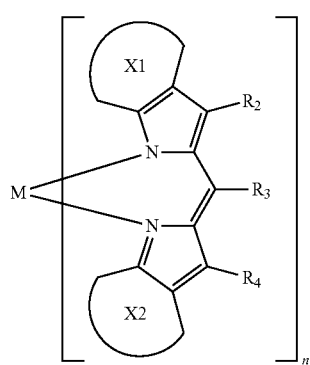
5
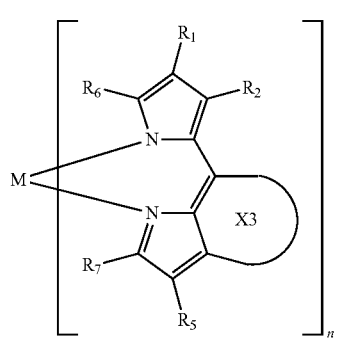
6
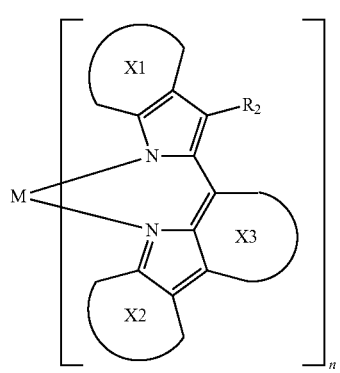
7
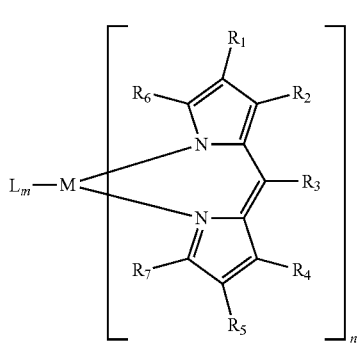
8
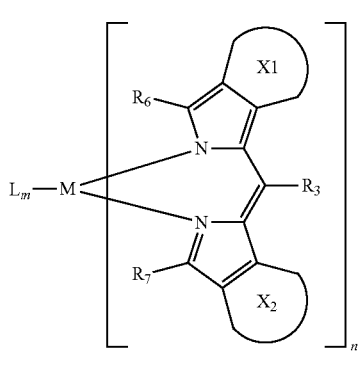
9
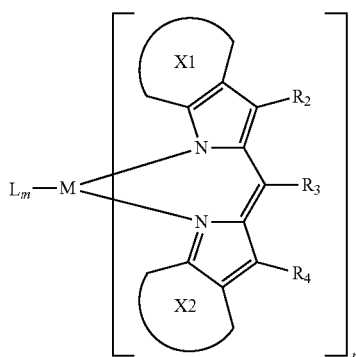
10
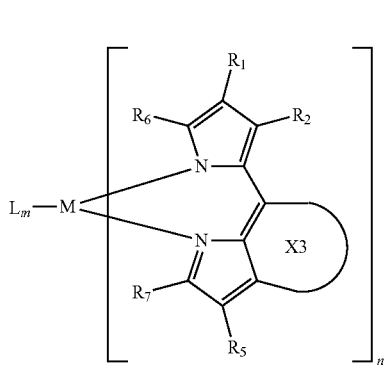
and

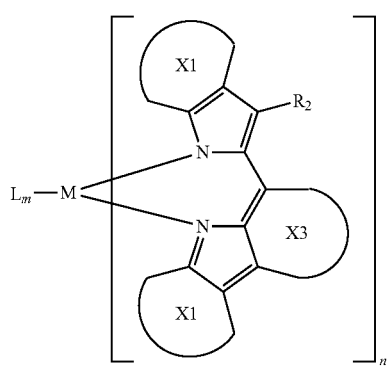

wherein X$_{1-2}$ are independently chosen from

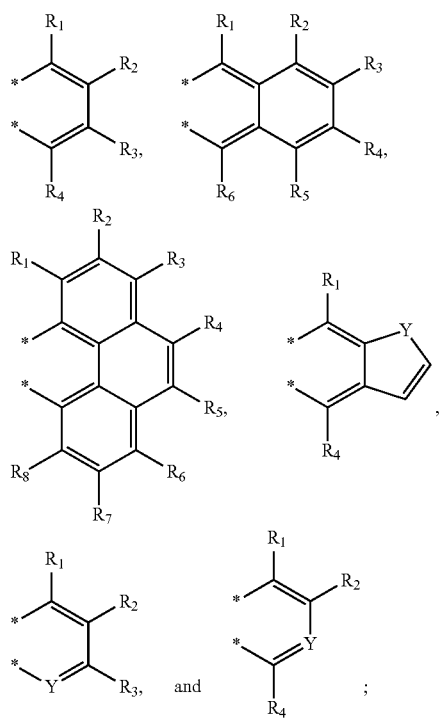

X$_3$ is chosen from

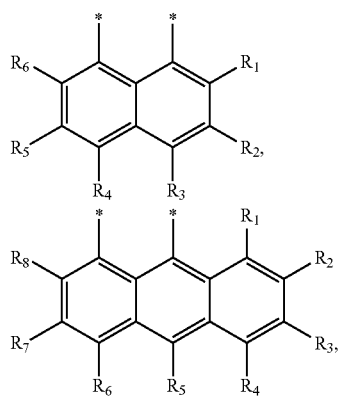

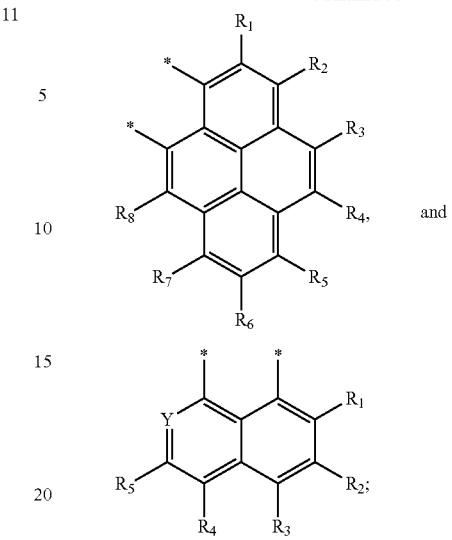

M is chosen from a metal and boron; n is chosen from 1, 2, and 3; L is chosen from inorganic and organic ligands with mono- or multiple coordinating sites; Y is a heteroatom; and R$_{1-n}$ are independently chosen from H and inorganic and organic functional groups such that the conditions for the acceptor material and the at least one acceptor sensitizer are satisfied. In certain embodiments, R$_{1-n}$ are independently chosen from —NO$_2$, halogens, —CN, —SCN, alkyl, aryl, —OR, —SR, —COOR, —CRO, and H.

In some embodiments, the at least one acceptor sensitizer is a compound chosen from

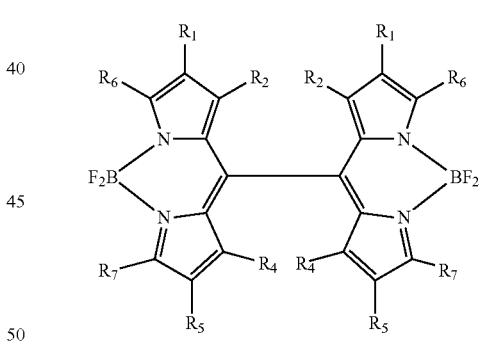

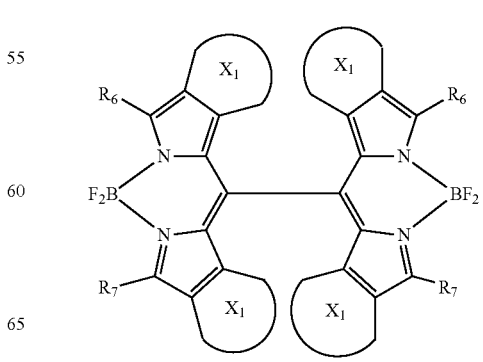

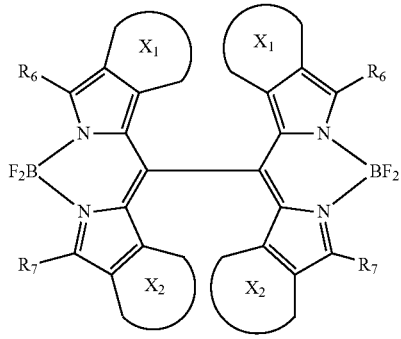
14
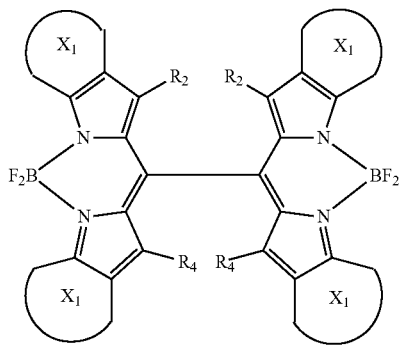
15
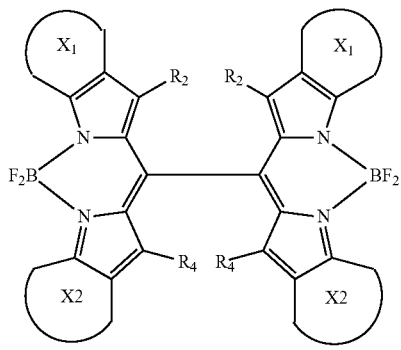
16
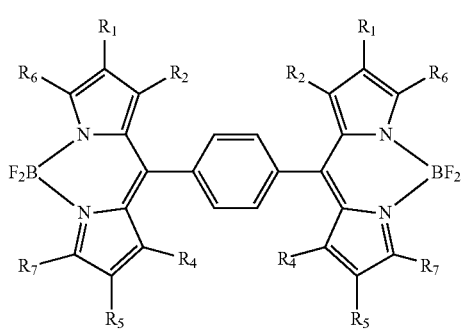
17
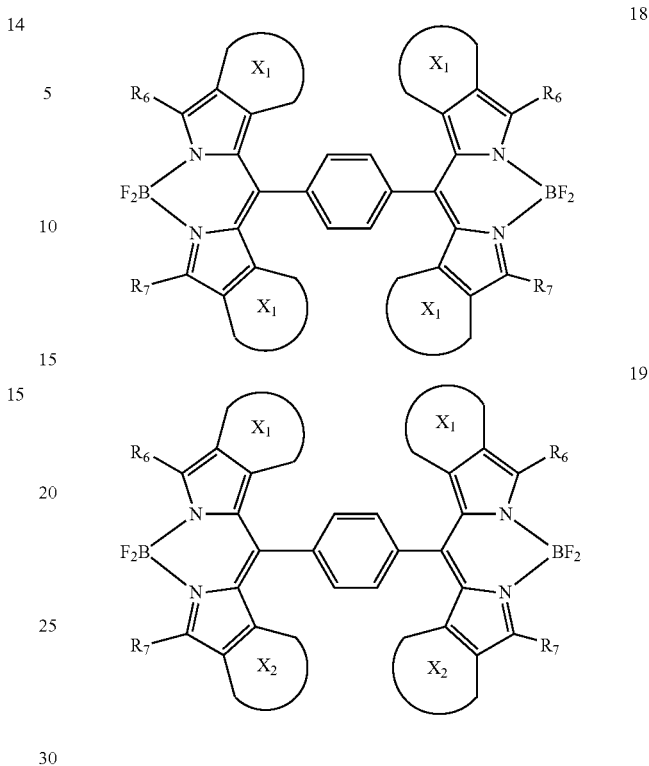
18
19
20 and
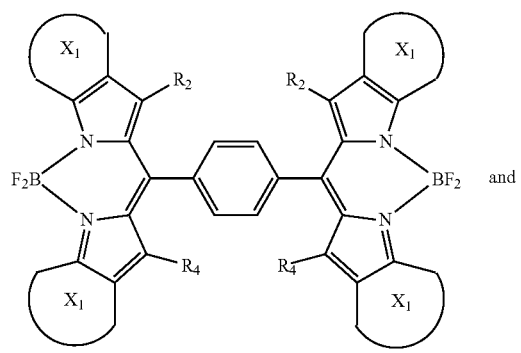
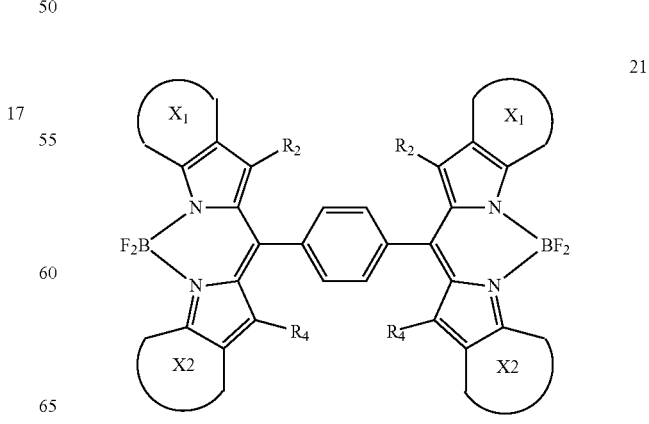
21 wherein $X_{1-2}$ are independently chosen from

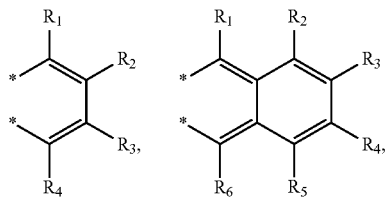

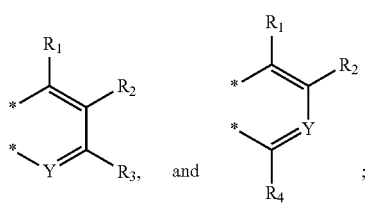

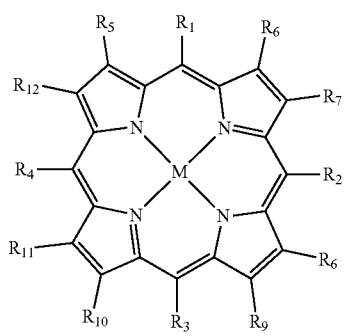

Y is a heteroatom; and $R_{1-n}$ are independently chosen from H and inorganic and organic functional groups such that the conditions for the acceptor material and the at least one acceptor sensitizer are satisfied. In certain embodiments, $R_{1-n}$ are independently chosen from —NO$_2$, halogens, —CN, —SCN, alkyl, aryl, —OR, —SR, —COOR, —CRO, and H.

In some embodiments, the at least one acceptor sensitizer is a compound chosen from

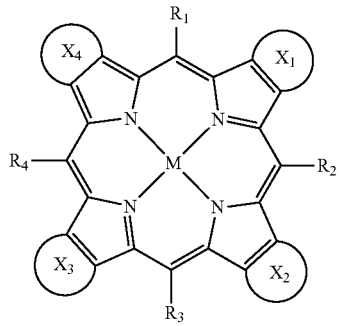

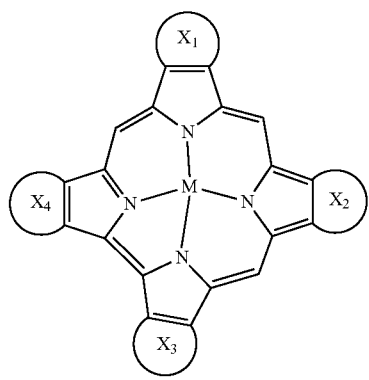

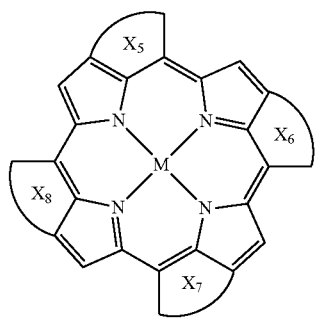

wherein $X_{1-4}$ are independently chosen from

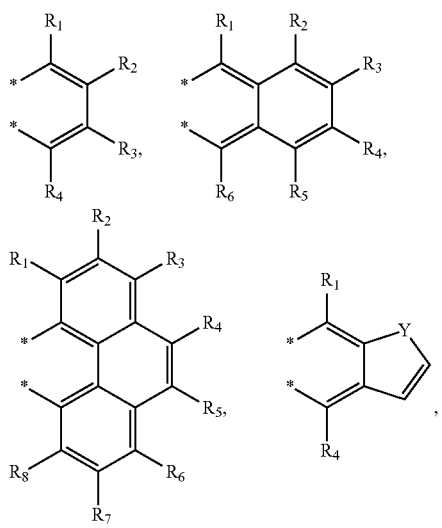

-continued

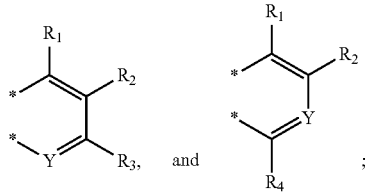 and ;

$X_{5-8}$ are independently chosen from

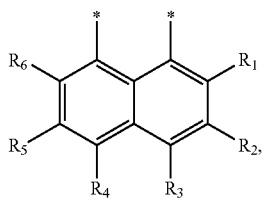

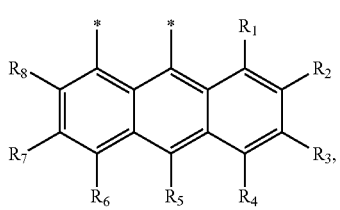

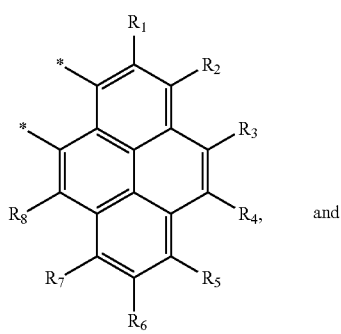 and

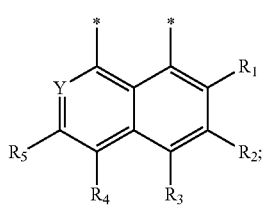

M is chosen from a metal and boron; Y is a heteroatom; and $R_{1-n}$ are independently chosen from H and inorganic and organic functional groups such that the conditions for the acceptor material and the at least one acceptor sensitizer are satisfied. In certain embodiments, $R_{1-n}$ are independently chosen from —$NO_2$, halogens, —CN, —SCN, alkyl, aryl, —OR, —SR, —COOR, —CRO, and H.

In some embodiments, the at least one acceptor sensitizer is a compound chosen from

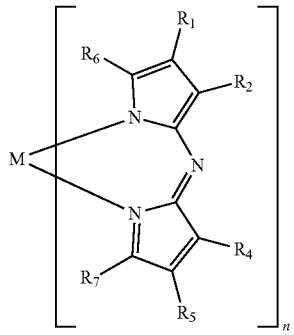

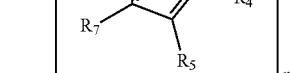

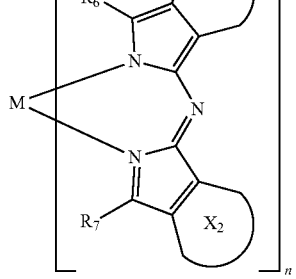

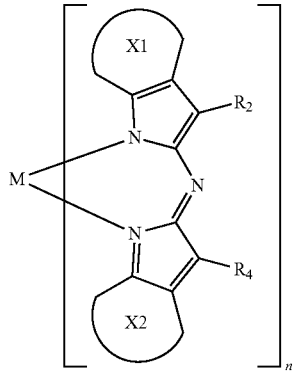

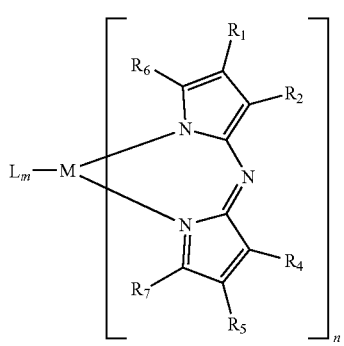

-continued

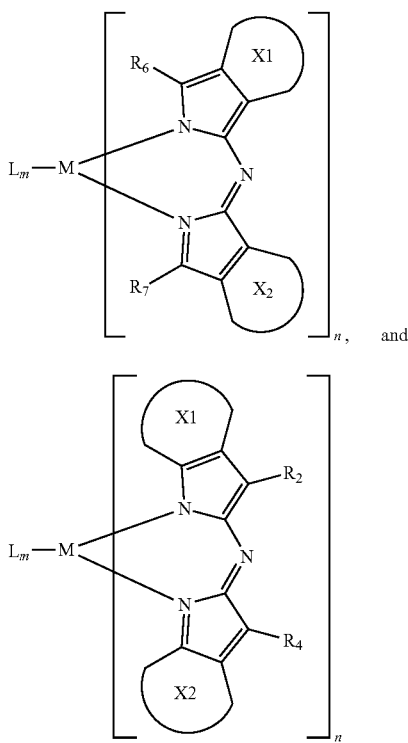

wherein $X_{1-2}$ are independently chosen from

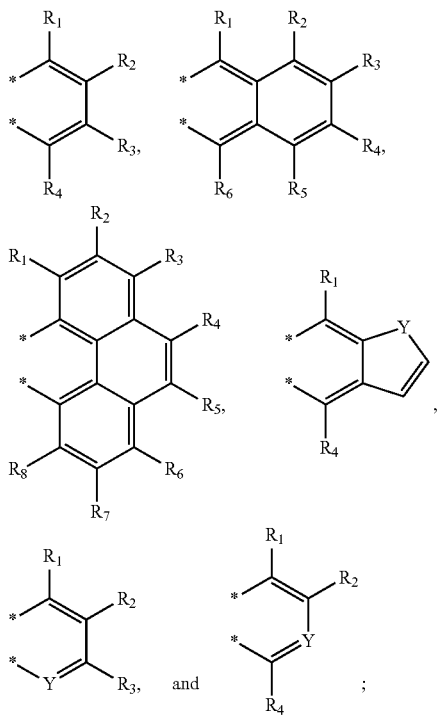

M is chosen from a metal and boron; n is chosen from 1, 2, and 3; L is chosen from inorganic and organic ligands with mono- or multiple coordinating sites; Y is a heteroatom; and $R_{1-n}$ are independently chosen from H and inorganic and organic functional groups such that the conditions for the acceptor material and the at least one acceptor sensitizer are satisfied. In certain embodiments, $R_{1-n}$ are independently chosen from —$NO_2$, halogens, —CN, —SCN, alkyl, aryl, —OR, —SR, —COOR, —CRO, and H.

The at least one acceptor sensitizer of the present disclosure may be a multichromophoric sensitizer. In some embodiments, the multichromophoric sensitizer has a structure chosen from

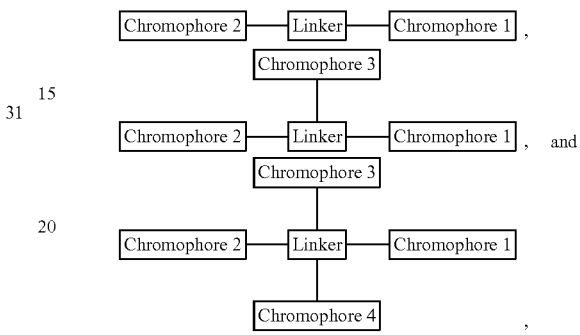

wherein the linker is an organic compound, and chromophores 1 to 4 are chosen from dipyrrins, phthalocyanines, subphthalocyanines, porphyrins, and azadipyrrins.

In other embodiments, the multichromophoric sensitizer has a structure chosen from

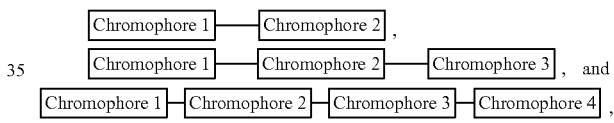

such that each chromophore is directly connected to one or more chromophores, and chromophores 1 to 4 are chosen from dipyrrins, phthalocyanines, subphthalocyanines, porphyrins, and azadipyrrins.

The mixed organic acceptor layer may have a thickness in a range of, for example, 5 to 1000 nm, such as 5 to 500 nm, 5 to 150 nm, 10 to 125 nm, 15 to 100 nm, 20 to 90 nm, 20 to 70 nm, or 30 to 60 nm.

In some embodiments, the mixture of the acceptor material and the at least one acceptor sensitizer in the mixed organic acceptor layer has an acceptor:sensitizer ratio in a range of 10:1 to 1:2.

Figure 3:
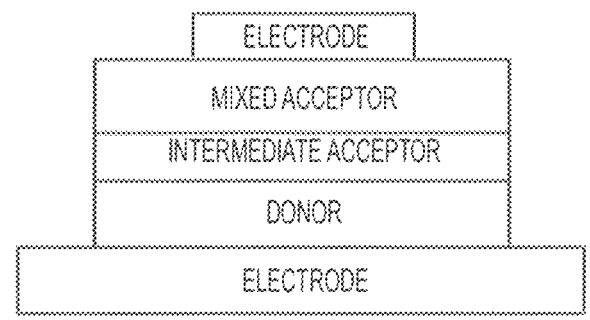
FIG. 3 shows a schematic of an organic photosensitive optoelectronic device comprising an organic mixed acceptor layer and an intermediate acceptor layer in accordance with the present disclosure.

As shown in FIG. 3, the organic photosensitive optoelectronic devices of the present disclosure may include an intermediate acceptor layer located between the mixed acceptor layer and the donor layer. The intermediate acceptor layer may form a donor-acceptor heterojunction with the donor layer. In certain embodiments, the intermediate acceptor layer, as recited throughout this disclosure, may consist of the acceptor material. In some embodiments, the intermediate acceptor layer consists of the acceptor material and other organic material. In some embodiments, at least 50%, at least 60%, at least 70%, at least 80%, at least 90%, at least 95%, at least 96%, at least 97%, at least 98%, at least 99%, or at least 99.9% of material comprising the intermediate acceptor layer is the acceptor material. Inclusion of the intermediate acceptor layer can ensure that excitons charge separate at the interface of the acceptor material and the donor layer. The intermediate acceptor layer may have a thickness in a range of, for example, 5 to 1000 nm, such as 5 to 500 nm, 5 to 100 nm, 10 to 50 nm, or 15 to 35 nm.

The at least one acceptor sensitizer of the present disclosure may comprise two or more acceptor sensitizers. In some embodiments, the at least one acceptor sensitizer comprises a first acceptor sensitizer and a second acceptor sensitizer. The absorption bands of the first acceptor sensitizer, the second acceptor sensitizer, and the acceptor material may complement one another to expand the overall absorption of the mixed organic acceptor layer. That is, in some embodiments, to optimize absorption, the first acceptor sensitizer, the second acceptor sensitizer, and the acceptor material do not exhibit substantially similar absorptivity over the same wavelengths. In some embodiments, the first acceptor sensitizer has a maximum absorptivity at one or more wavelengths, wherein the maximum absorptivity of the first acceptor sensitizer is at least twice as large as the absorptivities of the second acceptor sensitizer and the acceptor material, respectively, at the one or more wavelengths. In some embodiments, the second acceptor sensitizer has a maximum absorptivity at one or more wavelengths, wherein the maximum absorptivity of the second acceptor sensitizer is at least twice as large as the absorptivities of the first acceptor sensitizer and the acceptor material, respectively, at the one or more wavelengths.

Figure 4:
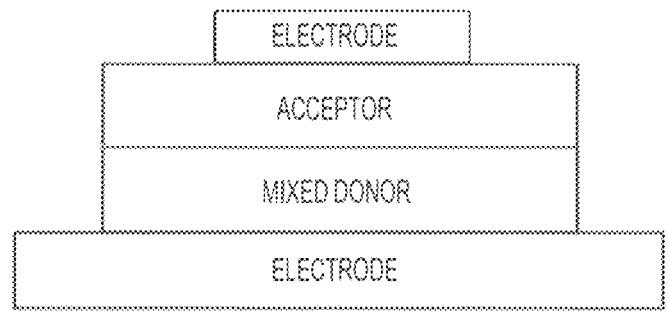
FIG. 4 shows a schematic of an organic photosensitive optoelectronic device comprising an organic mixed donor layer in accordance with the present disclosure.

In another embodiment of the present disclosure, an organic donor material of a photosensitive optoelectronic device can be mixed with a donor sensitizer to form a mixed organic donor layer. For example, as shown in FIG. 4, the device comprises two electrodes in superposed relation with a mixed organic donor layer and an organic acceptor layer located between the two electrodes.

The organic acceptor layer comprises at least one acceptor material. The mixed organic donor layer comprises a mixture of a donor material and at least one donor sensitizer. The interface between the mixed organic donor layer and the acceptor layer may form a donor-acceptor heterojunction. Absorption bands of the donor material and the at least one donor sensitizer may complement one another to expand the overall absorption of the mixed organic donor layer. That is, in some embodiments, to optimize absorption, the donor material and the donor sensitizer(s) do not exhibit substantially similar absorptivity over the same wavelengths. In some embodiments, the at least one donor sensitizer has a maximum absorptivity at one or more wavelengths, wherein the maximum absorptivity is at least twice as large as the absorptivity of the donor material at the one or more wavelengths. In some embodiments, the at least one donor sensitizer has an absorptivity of at least $10^3$ cm$^{-1}$ at one or more wavelengths ranging from 350 to 950 nm. In some embodiments, the at least one donor sensitizer has an absorptivity of at least $10^3$ cm$^{-1}$ at one or more wavelengths ranging from 450 to 700 nm.

As with the at least one acceptor sensitizer, an important feature of the present disclosure is efficient transfer of absorbed energy from the at least one donor sensitizer to the donor material. Thus, the at least one donor sensitizer and the donor material should be chosen to satisfy the following conditions:

the at least one donor sensitizer has a lowest triplet excited state energy ($E_{T-DSens}$) greater than or equal to a lowest triplet excited state energy ($E_{T-D}$) of the donor material;

the at least one donor sensitizer has an oxidation potential higher than or equal to an oxidation potential of the donor material; and if the at least one donor sensitizer and the donor material form a charge transfer (CT) state having a CT state energy, the CT state energy is greater than or equal to the lowest triplet excited state energy ($E_{T-D}$) of the donor material.

The at least one donor sensitizer having a lowest triplet excited state energy ($E_{T-DSens}$) greater than or equal to the lowest triplet excited state energy ($E_{T-D}$) of the donor material permits Dexter (triplet-triplet) energy transfer between the at least one donor sensitizer and the donor material. If the at least one donor sensitizer and the donor material form a CT state, a CT state energy greater than or equal to the lowest triplet excited state energy ($E_{T-D}$) of the donor material permits electron transfer to the donor material. The at least one donor sensitizer having an oxidation potential higher than or equal to the oxidation potential of the donor material allows for efficient energy transfer by preventing charge separation and/or carrier trapping.

The donor material and the at least one donor sensitizer may also be chosen such that the at least one donor sensitizer has a lowest singlet excited state energy ($E_{S-DSens}$) greater than or equal to a lowest singlet excited state energy ($E_{S-D}$) of the donor material. This arrangement permits Forster (singlet-singlet) energy transfer between the at least one donor sensitizer and the donor material.

The donor material and the at least one donor sensitizer may also be chosen such that the CT state energy, if formed, is greater than or equal to a lowest singlet excited state energy ($E_{S-D}$) of the donor material.

The size and shape of the at least one donor sensitizer may substantially match the size and shape of the donor material. In some embodiments, the mixture of the donor material and the at least one donor sensitizer form a solid solution.

Examples of suitable donor materials for the present disclosure include but are not limited to phthalocyanines, such as copper phthalocyanine (CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, borondipyrromethene (BODIPY) dyes, thiophenes, such as poly (3-hexylthiophene) (P3HT), polyacenes, such as pentacene and tetracene, diindenoperylene (DIP), and squaraine (SQ) dyes.

Examples of squaraine donor materials include but are not limited to 2,4-bis [4-(N,N-dipropylamino)-2,6-dihydroxyphenyl] squaraine, 2,4-bis[4-(N,N-diisobutylamino)-2,6-dihydroxyphenyl] squaraine, 2,4-bis[4-(N,N-diphenylamino)-2,6-dihydroxyphenyl] squaraine (DPSQ) and salts thereof. Additional examples of suitable squaraine materials are disclosed in U.S. Patent Publication No. 2012/0248419, which is incorporated herein by reference for its disclosure of squaraine materials.

The at least one donor sensitizer may be chosen, for example, from subphthalocyanines, porphyrins, phthalocyanines, dipyrrins and metal complexes thereof, boron dipyrromethene (BODIPY) dyes, squaraines, oligothiophenes, acenes and derivatives thereof. The at least one donor sensitizer may be chosen from any of compounds 1 to 31 as described herein. It should be appreciated that absorption, singlet and triplet energies, and reduction/oxidation potential of candidate materials for the at least one donor sensitizer may be tuned by attaching functional groups.

The mixed organic donor layer may have a thickness in a range of, for example, 5 to 1000 nm, such as 5 to 500 nm, 5 to 150 nm, 10 to 125 nm, 15 to 100 nm, 20 to 90 nm, 20 to 70 nm, or 30 to 60 nm.

In some embodiments, the mixture of the donor material and the at least one donor sensitizer in the mixed organic donor layer has a donor:sensitizer ratio in a range of 10:1 to 1:2.

Figure 5:
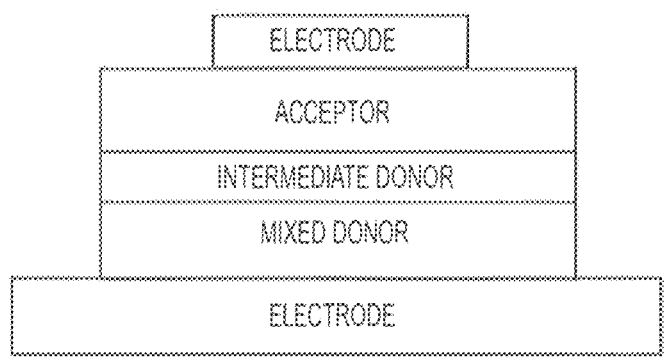
FIG. 5 shows a schematic of an organic photosensitive optoelectronic device comprising an organic mixed donor layer and an intermediate donor layer in accordance with the present disclosure.

As shown in FIG. 5, the organic photosensitive optoelectronic devices of the present disclosure may include an intermediate donor layer located between the mixed donor layer and the acceptor layer. The intermediate donor layer may form a donor-acceptor heterojunction with the acceptor layer. In certain embodiments, the intermediate donor layer, as recited throughout this disclosure, may consist of the donor material. In some embodiments, the intermediate donor layer consists of the donor material and other organic material. In some embodiments, at least 50%, at least 60%, at least 70%, at least 80%, at least 90%, at least 95%, at least 96%, at least 97%, at least 98%, at least 99%, or at least 99.9% of material comprising the intermediate donor layer is the donor material. Inclusion of the intermediate donor layer can ensure that excitons charge separate at the interface of the donor material and the acceptor layer. The intermediate donor layer may have a thickness in a range of, for example, 5 to 1000 nm, such as 5 to 500 nm, 5 to 100 nm, 10 to 50 nm, or 15 to 35 nm.

Figure 6:
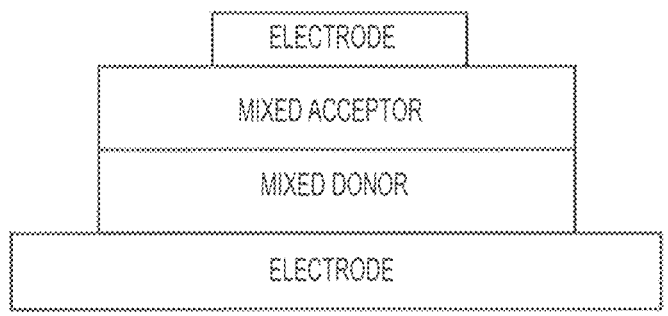
FIG. 6 shows a schematic of an organic photosensitive optoelectronic device comprising an organic mixed acceptor layer and an organic mixed donor layer in accordance with the present disclosure.

As shown in FIG. 6, organic photosensitive optoelectronic devices of the present disclosure may comprise both a mixed acceptor layer and a mixed donor layer. The mixed acceptor layer comprises a mixture of an acceptor material and at least one acceptor sensitizer as described herein. The mixed donor layer comprises a mixture of a donor material and at least one donor sensitizer as described herein. As described herein, absorption bands of the acceptor material and the at least one acceptor sensitizer may complement one another to expand the overall absorption of the mixed organic acceptor layer. Similarly, the absorption bands of the donor material and the at least one donor sensitizer may complement one another to expand the overall absorption of the mixed organic donor layer.

For a device that has both sensitized donor and sensitized acceptor layers, the sensitizers may be chosen to maximize the absorption overlap of the mixed acceptor and donor layers within the solar spectrum. This may involve choosing sensitizers that absorb in different wavelength ranges. Alternatively, sensitizers with partial or full overlap of their absorption spectra may be chosen to maximize the thin film absorptivity of the mixed donor and acceptor layers in a given wavelength range.

Figure 7:
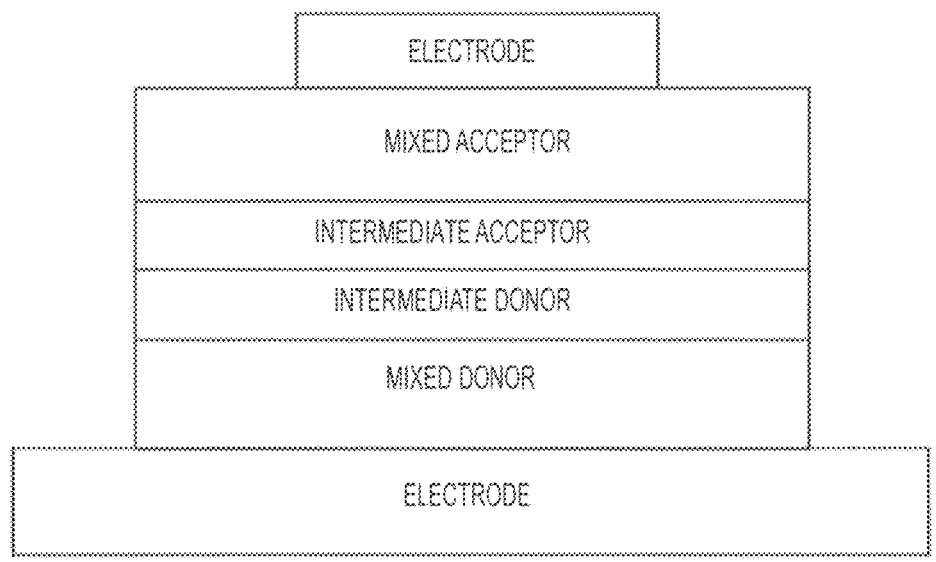
FIG. 7 shows a schematic of an organic photosensitive optoelectronic device comprising an organic mixed acceptor layer, an organic mixed donor layer, an intermediate acceptor layer, and an intermediate donor layer in accordance with the present disclosure.

As shown in FIG. 7, the devices with a mixed organic acceptor layer and a mixed organic donor layer may include an intermediate acceptor layer as described herein and an intermediate donor layer as described herein. The intermediate acceptor layer is adjacent to the mixed organic acceptor layer, and the intermediate donor layer is adjacent to the mixed organic donor layer, both intermediate layers being positioned between the mixed organic acceptor layer and the mixed organic donor layer. The intermediate acceptor layer and the intermediate donor layer may form a donor-acceptor heterojunction. The intermediate layers may have thicknesses as described herein.

One of the electrodes of the present disclosure may be an anode, and the other electrode a cathode. It should be understood that the electrodes should be optimized to receive and transport the desired carrier (holes or electrons). The term "cathode" is used herein such that in a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner.

In accordance with the present description, the optoelectronic devices, such as organic PVs, may have a conventional or inverted structure. Examples of inverted device structures are disclosed in U.S. Patent Publication No. 2010/0102304, which is incorporated herein by reference for its disclosure of inverted device structures.

The organic photosensitive optoelectronic devices of the present disclosure may further comprise additional layers as known in the art for such devices. For example, devices may further comprise charge carrier transport layers and/or buffers layers such as one or more blocking layers, such as an exciton blocking layer (EBL). One or more blocking layers may be located between the photoactive region and either or both of the electrodes. With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium (III) (Ru(acac)$_3$), and aluminum(III)phenolate (Alq$_2$ OPH), N,N'-diphenyl-N,N'-bis-alpha-naphthylbenzidine (NPD), aluminum tris(8-hydroxyquinoline) (Alq$_3$), and carbazole biphenyl (CBP). Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers.

The organic photosensitive optoelectronic devices of the present disclosure may comprise additional buffer layers as known in the art for such devices. For example, the devices may further comprise at least one smoothing layer. A smoothing layer may be located, for example, between the photoactive region and either or both of the electrodes. A film comprising 3,4-polyethylenedioxythiophene:polystyrenesulfonate (PEDOT:PSS) is an example of a smoothing layer.

The organic optoelectronic devices of the present disclosure may exist as a tandem device comprising two or more subcells. A subcell, as used herein, means a component of the device which comprises at least one donor-acceptor heterojunction. When a subcell is used individually as a photosensitive optoelectronic device, it typically includes a complete set of electrodes. A tandem device may comprise charge transfer material, electrodes, or charge recombination material or a tunnel junction between the tandem donor-acceptor heterojunctions. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments, the charge transfer layer or charge recombination layer may be chosen from Al, Ag, Au, MoO$_3$, Li, LiF, Sn, Ti, WO$_3$, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

In some embodiments, the donor-acceptor heterojunctions recited herein are chosen from a mixed heterojunction, a bulk heterojunction, a planar heterojunction, a nanocrystalline-bulk heterojunction, and a hybrid planar-mixed heterojunction.

The devices of the present disclosure may be, for example, photodetectors, photoconductors, or PV devices, such as solar cells.

Figure 8:
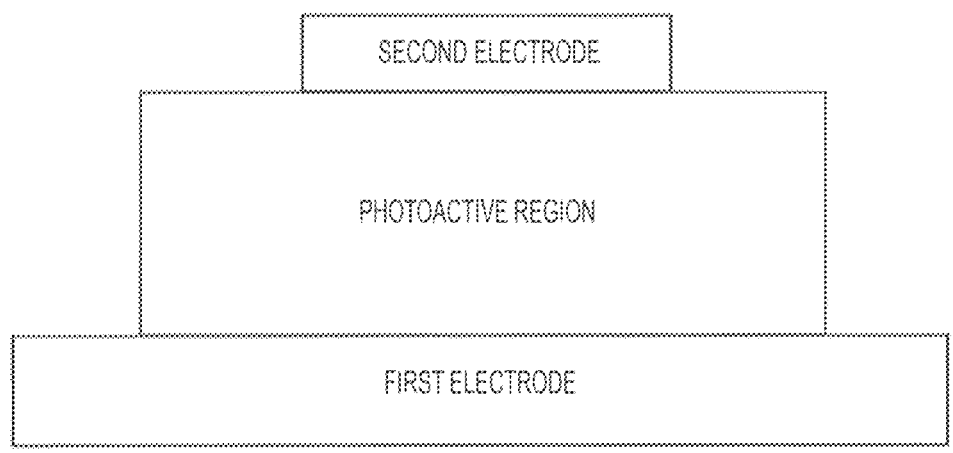
FIG. 8 shows a schematic of a photoactive region deposited over a first electrode and a second electrode deposited over the photoactive region.

Methods of preparing organic photosensitive optoelectronic devices of the present disclosure are also disclosed herein. In one embodiment, a method of fabricating an organic photosensitive optoelectronic device comprises depositing a photoactive region over a first electrode, and depositing a second electrode over the photoactive region (FIG. 8). The photoactive region may comprise a mixed organic acceptor layer and an organic donor layer (e.g., FIG. 1), wherein the mixed organic acceptor layer comprises a mixture of an acceptor material and at least one acceptor sensitizer, as described herein. The acceptor material and the at least one acceptor sensitizer are chosen to satisfy the conditions described herein for the mixed organic acceptor layer.

In some embodiments, depositing a photoactive region over a first electrode comprises depositing the organic donor layer over the first electrode, and co-depositing the acceptor material and the at least one acceptor sensitizer over the first electrode. The co-deposition of the acceptor material and the at least one acceptor sensitizer over the first electrode may occur before or after the deposition of the organic donor layer over the first electrode. As one of skill in the art would appreciate, if the first electrode is optimized to receive and transport holes, the organic donor layer should be deposited over the first electrode before the co-deposition of the mixed organic acceptor layer. If the first electrode is optimized to receive and transport electrons, the mixed acceptor layer should be deposited over the first electrode before deposition of the organic donor layer.

In some embodiments, the photoactive region further comprises an intermediate acceptor layer, as described herein (e.g., FIG. 3). In those embodiments, depositing a photoactive region over a first electrode may comprise depositing the organic donor layer over the first electrode, depositing the intermediate acceptor layer over the first electrode, and co-depositing the acceptor material and the at least one acceptor sensitizer over the first electrode. The co-deposition of the acceptor material and the at least one acceptor sensitizer over the first electrode may occur before or after the deposition of the organic donor layer, wherein the deposition of the intermediate acceptor layer results in the intermediate acceptor layer being positioned between the mixed acceptor layer and the organic donor layer.

In some embodiments, the organic donor layer of the photoactive region is a mixed organic donor layer comprising a mixture of a donor material and at least one donor sensitizer, as described herein (e.g., FIG. 4). The donor material and the at least one donor sensitizer are chosen to satisfy the conditions described herein for the mixed organic donor layer. In those embodiments, depositing a photoactive region over a first electrode may comprise co-depositing the donor material and the at least one donor sensitizer over the first electrode, and depositing the organic acceptor layer over the first electrode. The co-deposition of the donor material and the at least one donor sensitizer may occur before or after the deposition of the organic acceptor layer. In embodiments where the organic acceptor layer is a mixed organic acceptor layer (e.g., FIG. 6), the deposition of the organic acceptor layer may comprise co-deposition of the acceptor material and the at least one acceptor sensitizer. In embodiments where the photoactive region also includes the intermediate acceptor layer, the deposition of the photoactive region also comprises depositing the intermediate acceptor layer such that the intermediate acceptor layer is positioned between the mixed organic acceptor layer and the mixed organic donor layer.

In some embodiments, the photoactive region further comprises an intermediate donor layer, as described herein (e.g., FIG. 5). In those embodiments, depositing a photoactive region over a first electrode may comprise co-depositing the donor material and the at least one donor sensitizer over the first electrode, depositing the intermediate donor layer over the first electrode, and depositing the organic acceptor layer over the first electrode. The co-deposition of the donor material and the at least one donor sensitizer may occur before or after the deposition of the acceptor layer, wherein the deposition of the intermediate donor layer results in the intermediate donor layer being positioned between the mixed organic donor layer and the organic acceptor layer. In embodiments, where the organic acceptor layer is a mixed organic acceptor layer, the deposition of the organic acceptor layer may comprise co-deposition of the acceptor material and the at least one acceptor sensitizer. In embodiments, where the photoactive region also includes the intermediate acceptor layer (e.g., FIG. 7), the deposition of the photoactive region also comprises depositing the intermediate acceptor layer such that the intermediate acceptor layer is adjacent to the mixed organic acceptor layer, and the intermediate donor layer is adjacent to the mixed organic donor layer, both intermediate layers being positioned between the mixed organic acceptor layer and the mixed organic donor layer.

The ratio of the acceptor material to the at least one acceptor sensitizer during co-deposition in any of the embodiments described herein, may be in a range of 10:1 to 1:2

The ratio of the donor material to the at least one donor sensitizer during co-deposition in any of the embodiments described herein, may be in a range of 10:1 to 1:2.

As described herein, additional layers, such as blocking layers, smoothing layers, and other buffer layers known in the art for organic photosensitive optoelectronic devices may be deposited during fabrication of the devices.

Layers and materials may be deposited using techniques known in the art. For example, the layers and materials described herein can be deposited from a solution, vapor, or a combination of both. In some embodiments, the organic materials or organic layers can be deposited via solution processing, such as by one or more techniques chosen from spin-coating, spin-casting, spray coating, dip coating, doctor-blading, inkjet printing, or transfer printing.

In other embodiments, the organic materials may be deposited using vacuum evaporation, such as vacuum thermal evaporation, organic vapor phase deposition, or organic vapor-jet printing.

It should be understood that embodiments described herein may be used in connection with a wide variety of other structures. The specific materials and structures described are exemplary in nature, and other materials and structures may be used. Functional organic optoelectronic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLES

Example 1

Figure 9:
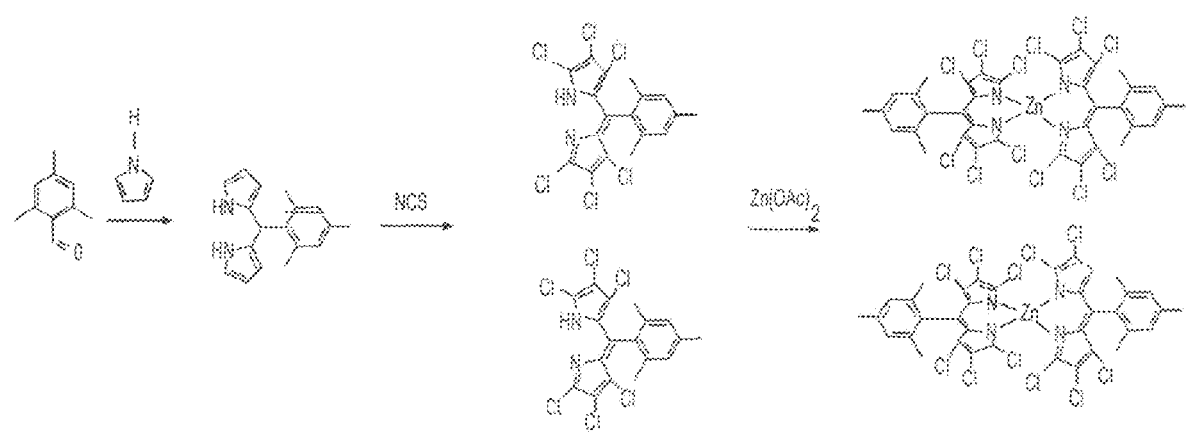
FIG. 9 shows a synthesis and structure for a chlorinated zinc dipyrrin compound (ZCl).

A zinc dipyrrin derivative (ZCl) was synthesized for use as a sensitizer in accordance with the present disclosure. ZCl strongly absorbs visible light (7-fold higher than $C_{60}$ at 540 nm). The synthesis and structure of ZCl are shown in FIG. 9.

To synthesize ZCl, 5-Mesityldipyrromethane was synthesized as follows: a mixture of mesitaldehyde (7 g, 47.2 mmol) and pyrrole (500 mL, 7.2 mol) in a 1000-mL single-neck round-bottomed flask was degassed with a stream of nitrogen for 10 min. $MgBr_2$ (4.60 g, 25.0 mmol) was added, and the mixture was stirred for 1.5 h at room temperature. The tan mixture was treated with powdered NaOH (15.0 g, 380 mmol). The mixture was stirred for 1 h and then filtered. The filtrate was concentrated, and the pyrrole was recovered. The crude solid obtained upon removal of pyrrole was extracted with 20% ethyl acetate/hexanes (7×100 ml). The extract was gravity-filtered through a pad of silica (80 g). The eluted solution was concentrated to obtain a viscous brown liquid. The viscous brown liquid was sublimed under vacuum ($10^{-3}$ torr) at 150° C., yielding yellow crystal. Crystallization [ethanol/water (4:1)] afforded white crystals 5.00 g, 43% yield.

ZCl was then synthesized as follows: 0.62 g (2.34 mmol) of 5-Mesityldipyrromethane was dissolved in 60 mL freshly distilled THF. The solution was cooled using a dry ice/acetone bath. $N_2$ was bubbled through the reaction mixture for 5 min. 2.2 g (16.4 mmol) of N-chlorosuccinimide (NCS) in 70 mL of THF was slowly added to DPM solution. The reaction mixture was stirred for 2 hours in dry ice/acetone bath under $N_2$ in the dark. The reaction was allowed to slowly warm to room temperature for 10 hours. THF was evaporated and the crude products were dissolved in 300 mL dichloromethane (DCM). The crude products were washed with $NaHCO_3$ solution and dried over $Na_2SO_4$. The dark red products in DCM were used without further purification. 2.5 g $Zn(OAc)_2 \cdot 2H_2O$ in 30 mL $CH_3OH$ was added to the products in DCM. The reaction mixture was stirred overnight at which point the solvent was evaporated. The products were dissolved in DCM and the inorganic solid was filtered off. The solution was washed with $Na_2CO_3$. DCM was evaporated. The crude product was passed through a short neutral $Al_2O_3$ column using DCM/hexanes (1/4). 0.4 g of the dark red product was collected. The product was dissolved in DCM and recrystallized by layering MeOH on top. 0.2 g of solid was collected (17% total yield). The product was further purified by gradient sublimation under vacuum ($10^{-5}$ torr) at 270° C.-200° C.-140° C. gradient temperature zones. The product ZCl was a mixture of two compounds: $C_{36}H_{22}Cl_{12}N_4Zn$ and $C_{36}H_{23}Cl_{11}N_4Zn$ with molar ratio 3:1 (general formula: $C_{144}H_{89}Cl_{47}N_{16}Zn_4$).

Figure 10:
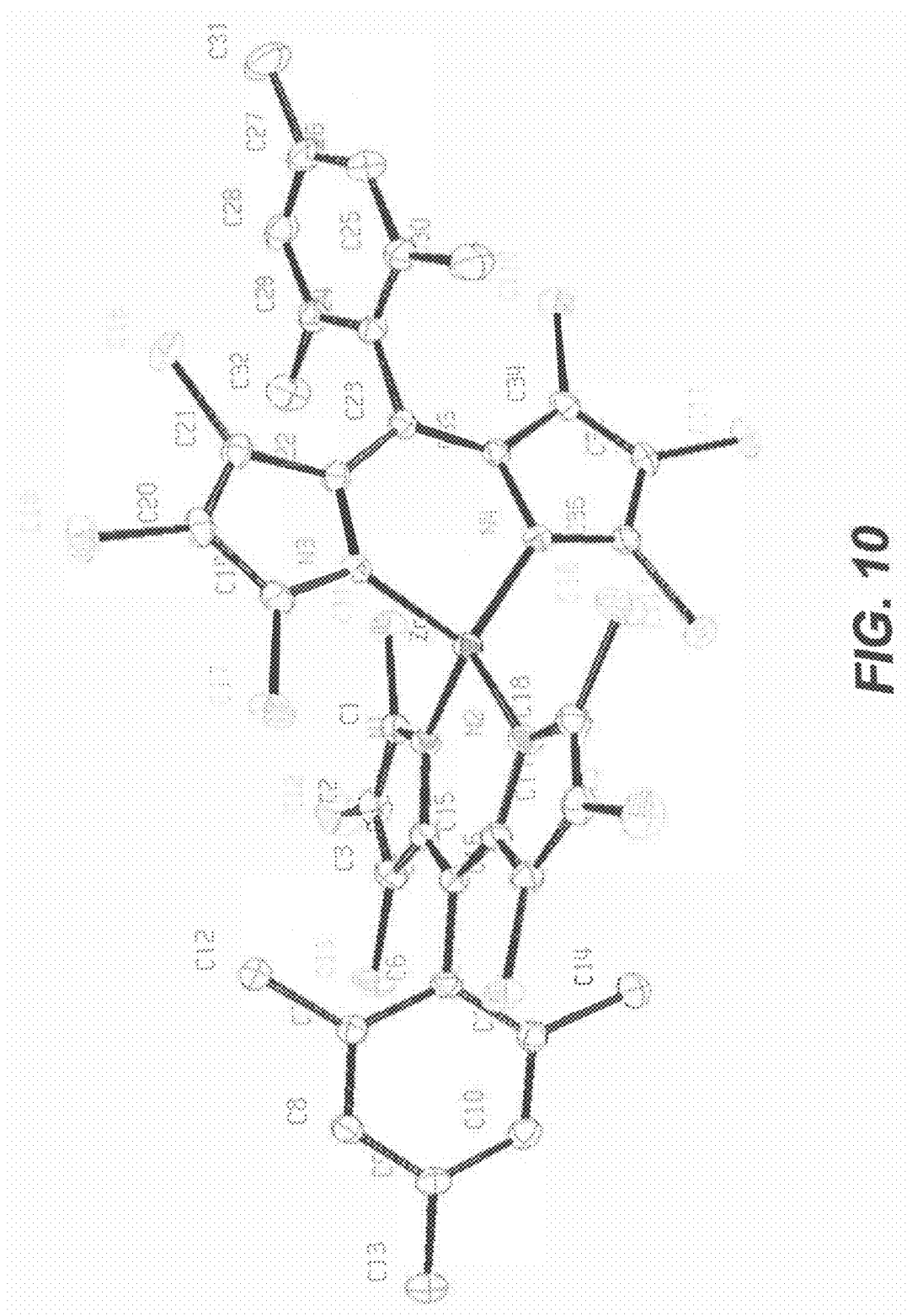
FIG. 10 shows an Ortep diagram of ZCl and space filling models of $C_{60}$ and ZCl in single crystals.
Figure 10:
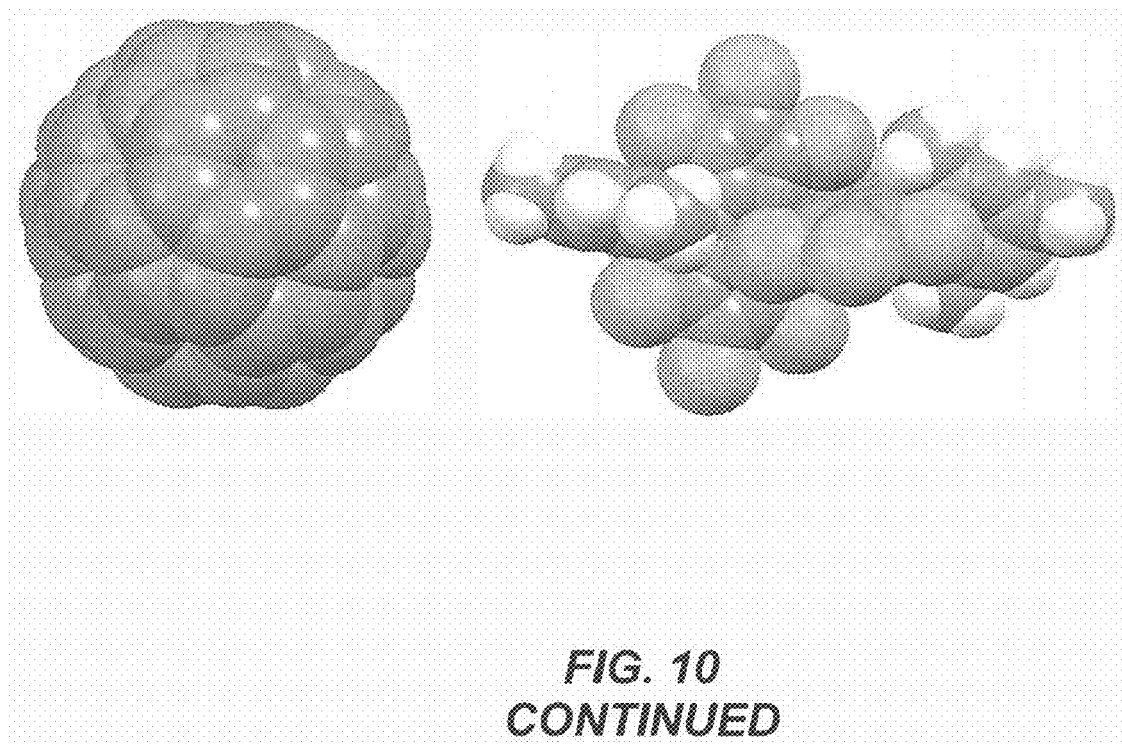

A single crystal of ZCl was grown by slow thermal sublimation under vacuum, and the mixture of $C_{36}H_{22}Cl_{12}N_4Zn$ and $C_{36}H_{23}Cl_{11}N_4Zn$ was co-crystalized. The structure was determined by X-ray diffraction measurement and is shown in FIG. 10.

Absorption (solid square) and emission (open circle) spectra of ZCl in methyl cyclohexane at room temperature are shown in FIG. 11A. An emission spectrum of ZCl in 2-methyl tetrahydrofuran at 77K is shown in FIG. 11B. The inset is the emission from the triplet state of ZCl. Absorption (solid symbols) and emission (open symbol) spectra of a $C_{60}$ film (square) and a ZCl film (triangle) are shown in FIG. 11C. FIG. 11D shows cyclic voltammetry (CV) and differential pulse voltammetry (DPV) diagrams of ZCl in dichloromethane (scan rate 100 mV/s).

Example 2

An iridium dipyrrin derivative (IrDP) was synthesized for use as a sensitizer in accordance with the present disclosure. The synthesis and structure of IrDP are shown in FIG. 12.

To synthesize IrDP, [IrCl($f_2$ppy)]$_2$ was synthesized as follows: $IrCl_3 \cdot 2H_2O$ (1.4 g, 4.70 mmol) and $f_2$ppy (4.00 g, 21.0 mmol) were dissolved in 2-EtOEtOH:$H_2O$ (120 mL:40 mL) and refluxed at 140° C. for 20 hrs. After cooling, yellow precipitate was filtered and washed with acetone:ethanol (120 mL:120 mL). The washed product was recrystallized in hexanes:toluene (20 mL:50 mL) to give yellow fine crystal (4.2 g, 3.46 mmol) in 78% yield.

IrDP was then synthesized as follows: 2,3-dichloro-5,6-dicyano-1,4-benzoquinone (DDQ) (1 mmol) was added to a solution of dipyrromethane (1 mmol) in 20 mL of dry tetrahydrofuran (THF) and was stirred at room temperature for 1 hr. A large excess of potassium carbonate (2 g) was then added, and the mixture was stirred for 15 min followed by the addition of [IrCl($f_2$ppy)]$_2$ (0.5 mmol). The solution was then refluxed under N2 overnight. After cooling to room temperature, solids were removed by vacuum filtration and washed with dichloromethane (3×100 mL). The collected filtrate was then evaporated to dryness under reduced pressure. The crude product was then passed through a silica gel column using dichloromethane/hexane (9:1) as eluent, and the first orange portion was collected. Solvent from the first orange fraction as then evaporated to dryness under reduced pressure. The pure product was precipitated with methanol ($CH_3OH$), collected by filtration, washed with $CH_3OH$, and air-dried. 0.55 g of red solid (70% yield) was collected. The product was further purified by gradient sublimation under vacuum ($10^{-5}$ torr) at 290° C.-230° C.-160° C. gradient temperature zones.

Absorption (solid symbol) and emission (open symbol) spectra of IrDP in dichloromethane solution under $N_2$ at room temperature (square) and 77K (circle) are shown in FIG. 13A. FIG. 13B shows a cyclic voltammetry diagram for IrDP (scan rate 100 mV/s). FIG. 13C shows absorption (solid symbols) of a $C_{60}$ film (square) and an IrDP film (triangle) and emission (open symbol) of IrDP under excitation at 500 nm.

Example 3

To study the energy transfer from ZCl to $C_{60}$ in a solid state, photoluminescence (PL) of mixed $C_{60}$:ZCl films with different volume ratios of ZCl was measured under excitation at 517 nm. The results are shown in FIG. 14A. As the amount of ZCl increased, the PL intensities of the films also increased, confirming efficient energy transfer from the ZCl sensitizer to $C_{60}$. The Forster energy transfer mechanism is shown in FIG. 14B.

The mixed $C_{60}$:ZCl films were compared to films of $C_{60}$ mixed with two other zinc dipyrrin derivatives, ZH and ZMe, respectively, having the following structures:

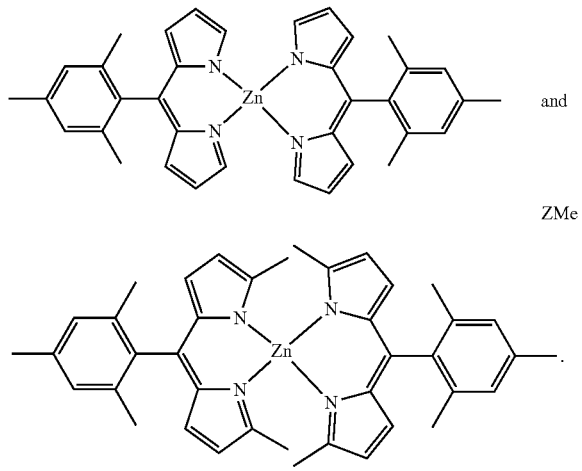

ZH and ZMe have similar singlet and triplet energies as ZCl, but have lower oxidation potentials. When $C_{60}$ is mixed with ZH and ZMe, respectively, electron transfer from ZH and ZMe to $C_{60}$ occurs upon light excitation forming charge transfer (CT) states $ZH^+C_{60}^-$ and $ZMe^+C_{60}^-$. Emissions from these CT states have broadening characteristics; the lower oxidation potential results in red-shifted and broader emission band from CT states.

Example 4

Different sensitizers were mixed with a $C_{60}$ acceptor in organic PV devices having a common N,N'-di-[(1-naphthyl)-N,N'-diphenyl]-1,1'-biphenyl)4,4'-diamine (NPD) donor layer, which does not absorb visible light. A reference device having a neat $C_{60}$ film was used to compare with devices having the mixed $C_{60}$: sensitizer layer. In the sensitizer devices, the mixed acceptor layer was sandwiched between thin films of $C_{60}$. In such a device structure, the charge separation occurs between $C_{60}$ and NPD at the donor-acceptor (DA) interface. Direct contact between sensitizer and donor layer was prevented, allowing observation of the sensitization effect. Schematics of the reference device and sensitizer test devices are shown in FIG. 15.

Current-voltage (J-V) characteristics under simulated 1 sun AM1.5 G illumination and external quantum efficiency (EQE) measurements of devices using ZCl, IrDP, $F_{12}$SubPc and hexachloro boron subphthalocyanine (Cl$_6$SubPc) sensitizers are shown in FIGS. 16, 17, 18, and 19, respectively. The structure of $F_{12}$SubPc is

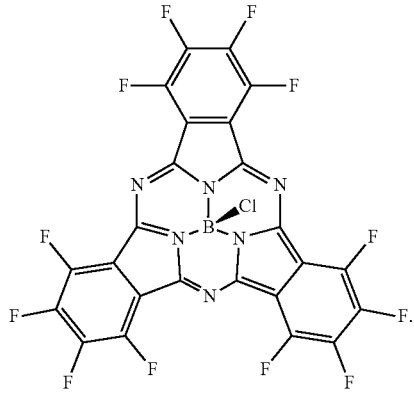

Device characteristics, including short circuit current ($J_{SC}$), open circuit voltage ($V_{OC}$), and fill factor (FF) of the devices are similar to the reference devices. As shown in the EQE curves for each sensitizer device, photoresponses for all sensitizers were observed at various wavelengths: 550 nm for ZCl, 500 nm for IrDP, and around 600 nm for $F_{12}$SubPc and Cl$_6$SubPc, which match well with their absorption spectra. This result clearly demonstrates that energy absorbed by the sensitizers is efficiently transferred to $C_{60}$, which further undergoes charge separation at the DA interface. On the other hand, the photoresponse from $C_{60}$ decreased in mixed acceptor layer devices. The enhanced photoresponse from sensitizers was compensated by the decrease in $C_{60}$ photoresponse, resulting in unchanged photocurrent in mixed acceptor devices compared to the reference devices. The results are summarized in FIG. 20.

Example 5

Device configurations were tested to increase the photoresponse of $C_{60}$. Devices were fabricated with a mixed acceptor layer ($C_{60}$:ZCl at 1:1) on top of a neat $C_{60}$ layer, the layers having various thicknesses, as shown in FIG. 21A. In all devices, the photoresponse from ZCl was observed. The results are shown in FIGS. 21B and 21C. Devices with a relatively thick layer of $C_{60}$ at the DA interface (D2, D3, and D4) showed increased photocurrents compared to the reference device, while devices with a thin $C_{60}$ layer or no $C_{60}$ layer showed lower photocurrent due to the decrease of $C_{60}$ photoresponse. Mixing ZCl with the $C_{60}$ acceptor did not affect other characteristics of the devices, such as VOC and FF. Thus, a relatively thick layer of $C_{60}$ may be placed at the DA interface to maintain the photoresponse from $C_{60}$.

Example 6

Mixed acceptor devices with a 15 nm and a 25 nm $C_{60}$ film, respectively, at the DA interface were further optimized by varying the thickness of the mixed acceptor layer ($C_{60}$:ZCl). The device structures and results are shown in FIGS. 22A and 22B. The thickness of the $C_{60}$:ZCl layer primarily affected Jsc, while $V_{OC}$ and FF remained unchanged. The optimal thickness of the $C_{60}$:ZCl layer was 50 nm for both devices. In the optimal devices, the photocurrent increased up to 33% in comparison with the reference device. These results are summarized in FIG. 22C.

Example 7

$C_{60}$:ZCl acceptor layer devices were fabricated using squaraine as the donor layer. The squaraine structure, device structures, and results are shown in FIGS. 23A, 23B, and 23C, respectively. In the reference device (D1), a dip in EQE was observed at 550 nm. Using ZCl as an acceptor sensitizer (device D2) fills the dip, resulting in 1 mA/cm² increase in photocurrent. These results are summarized in FIG. 23D.

Example 8

Devices were fabricated with multiple sensitizers blended with a $C_{60}$ acceptor. Two energy sensitizers, zinc chlorodipyrrin (ZCl) and hexachloro boron subphthalocyanine ($Cl_6SubPc$), were utilized to harvest photons in the visible portion of the solar spectrum and transfer energy to $C_{60}$.

The AM1.5 G solar spectrum is compared to the thin film extinction spectra of the active materials in FIG. 24A. Extinction coefficients for the thin films were calculated from optical constants measured by variable angle spectroscopic ellipsometry. Steady-state emission measurements in the thin film and solutions were performed using a Photon Technology International QuantaMaster Model C-60SE spectrofluorimeter. $C_{60}$ shows strong absorption in the UV range due to allowed transitions and another feature between $\lambda$=400 nm and 550 nm due to a charge transfer transition. The absorption of $C_{60}$ is most intense in the blue spectrum, while its singlet energy is in the red. ZCl has an extremely intense absorption between $\lambda$=450 nm and 575 nm and $Cl_6SubPc$ absorbs between $\lambda$=500 nm and 650 nm. The blended $C_{60}$:ZCl:$Cl_6SubPc$ (2:1:1 by volume) film showed contributions from all three components and has significantly more absorbance than pure $C_{60}$ between $\lambda$=500 nm and 625 nm. The near-infra red (NIR) absorbing donor DPSQ absorbs between $\lambda$=600 nm and 800 nm. The donor absorption in conjunction with that of the codeposited film should extend the absorption of the sensitized device from the UV to the NIR.

The normalized emission spectra for ZCl and $Cl_6SubPc$ with the absorption spectra of $C_{60}$ are shown in FIG. 24B. Steady-state emission measurements in the thin film and solutions were performed using a Photon Technology International QuantaMaster Model C-60SE spectrofluorimeter. ZCl emits between $\lambda$=545 nm and 600 nm and $Cl_6SubPc$ emits between $\lambda$=600 nm and 700 nm. As is apparent from FIG. 24, there is significant spectral overlap between the emission of the sensitizers and the absorption of $C_{60}$.

The reduction potential and singlet and triplet energies of ZCl, $Cl_6SubPc$, and $C_{60}$ are given in FIG. 25. The arrows in FIG. 25 outline a schematic for energy transfer pathways from ZCl and $Cl_6SubPc$ to $C_{60}$. Both ZCl and $Cl_6SubPc$ should function as sensitizers, as their singlet and triplet energies are greater than or equal to that of $C_{60}$ ensuring that any excitons generated on the sensitizers will be transferred to $C_{60}$ and not trapped on the sensitizer. Additionally, the reduction potentials of the sensitizers are less than that of $C_{60}$ ensuring that electrons are conducted out via $C_{60}$.

Lamellar OPV devices were fabricated to illustrate the impact of sensitization on device performance. Devices were grown on glass substrates with 150 nm indium tin oxide patterned in 2 mm stripes. Prior to deposition, the substrates were cleaned in a surfactant and a series of solvents as described previously and then exposed to ozone atmosphere for 10 min immediately before loading into the high vacuum chamber (base pressure<$10^{-6}$ torr). $MoO_3$ was thermally evaporated at 0.02 nm/s. A subset of the samples were then removed from the chamber where a 4-bis[4-(N, N-diphenylamino)-2,6-dihydroxyphenyl] squaraine (DPSQ) film was spin-coated from 1.5 mg/ml solutions in chloroform. The remaining samples were left in the chamber where N,N'-di-[(1-naphthyl)-N,N'-diphenyl]-1,1'-biphenyl)-4,4'-diamine (NPD) was thermally evaporated at 0.1 nm/s. Next, $C_{60}$ was thermally evaporated at 0.1 nm/s.

The sensitized devices contained a blended later of $C_{60}$: ZCl:$Cl_6SubPc$ deposited at $C_{60}$ (0.05 nm/s):ZCl (0.025 nm/s):$Cl_6SubPc$ (0.025 nm/s). All devices were capped with a buffer layer consisting of 10 nm BCP deposited at 0.1 nm/s. Finally, a 100 nm thick Al cathode was deposited at 0.2 nm/s through a shadow mask with a 2 mm slit defining a device area of 0.04 cm². Current density vs. voltage (J-V) characteristics were measured in the dark and under simulated AM 1.5 G solar illumination from a filtered 300 W Xe lamp. J-V measurements were carried out with an illumination area larger than that defined by the cathode. Routine spectral mismatch corrections were performed using a silicon photodiode calibrated at National Renewable Energy Laboratory. Chopped and filtered monochromatic light (250 Hz, 10 nm fwhm) from a Cornerstone 260 1/4 M double grating monochromator (Newport 74125) was used in conjunction with an EG&G 7220 lock-in amplifier to perform all EQE and spectral mismatch correction measurements. EQE measurements were carried out with an illumination area smaller than that defined by the cathode.

Device structures are shown in FIG. 26A. In order to ensure that all excitons that reach the donor/acceptor (D/A) interface were transported through $C_{60}$ and to eliminate any changes in the kinetics or thermodynamics of charge separation and recombination, a neat layer of $C_{60}$ was placed between the sensitized layer and the D/A interface. As a control to demonstrate an unambiguous photoresponse from the sensitizers in the acceptor layer, a wide energy gap donor, NPD, was used. Devices were also fabricated using DPSQ as the donor. Current-voltage (J-V) and external quantum efficiency (EQE) characteristics for the devices are shown in FIG. 26B, and the performance parameters are summarized in FIG. 26C. The open circuit voltage ($V_{OC}$) of the NPD sensitized and unsensitized devices remained unchanged at 0.87 V, indicating that the preservation of the D/A interface achieved its desired effect. The fill factor (FF) of the devices were 0.47 and 0.49 for both the unsensitized and sensitized devices, respectively. The photoresponse increase from a short circuit current ($J_{SC}$) of 3.0 mA/cm² (NPD) to 4.3 mA/cm² (NPD(s)). The EQE revealed that in the sensitized device, the increase in response was due to both ZCl and $Cl_6SubPc$ absorption. The ZCl contribution was evident between $\lambda$=500 nm and 575 nm, while the $Cl_6SubPc$ signal was seen between $\lambda$=575 nm and 650 nm. The unaltered $V_{OC}$ and slight increase in FF combined with the increase in $J_{SC}$ resulted in a power conversion efficiency ($\eta_p$) increase from 1.25% (NPD) to 1.81% (NPD(s)) on sensitization.

The continuing development of NIR absorbing donors has led to a gap in the absorption for devices containing fullerenes. This causes an EQE droop which is typified in $C_{60}$/DPSQ devices where the $C_{60}$ photoresponse tails off at $\lambda$=500 nm and the DPSQ photoresponse is strongest between $\lambda$=700 nm and 800 nm. The $V_{OC}$ of the sensitized DPSQ device (DPSQ(s)) increased slightly from 0.92 V to 0.93 V (FIGS. 26B and 26C). The FF of the unsensitized and sensitized devices were 0.63 and 0.59, respectively. Sensitization led to a marked increase in photocurrent from $J_{SC}$=6.5 mA/cm² to 8.6 mA/cm² for DPSQ and DPSQ(s), respectively. The EQE revealed that the increase in response was due to both ZCl and Cl₆SubPc sensitization. The ZCl enhancement was evident between λ=500 nm and 575 nm, while the Cl₆SubPc signal was seen between λ=575 nm and 650 nm. The sensitizers completely filled the droop in absorption resulting in a dramatically enhanced $\eta_p$ from 3.8% to 4.7%. The final device had broadband spectral coverage with EQE in excess of 20% from λ=350 nm to 800 nm.

Example 9

Lamellar OPV devices were fabricated to illustrate the impact of donor sensitization on device performance. In the devices, a squaraine donor was sensitized with SubPc. Fabricated device structures are shown in FIG. 27A. Current-voltage (J-V) and external quantum efficiency (EQE) characteristics for the devices are shown in FIG. 27B, and performance parameters are summarized in the table below. The open circuit voltage ($V_{OC}$) of the devices increased on the inclusion of the SubPc sensitizer from 0.68 V to 0.93 V. The fill factor (FF) remained unaltered at 0.49 for both devices, respectively. The photoresponse also remained unchanged at a $J_{SC}$ of 6.2 mA/cm². The EQE revealed that in the sensitized device, response was due to both SubPc and Sq absorption. The SubPc contribution was evident between λ=500 nm and 650 nm. The unaltered $J_{SC}$ and FF combined with the increase in $V_{OC}$ resulted in a power conversion efficiency ($\eta_p$) increase from 2.1% (Sq) to 2.8% (Sq:SubPc) on sensitization.

What is claimed is:

1. An organic photosensitive optoelectronic device comprising:
   two electrodes in superposed relation;
   an organic acceptor layer and a mixed organic donor layer located between the two electrodes;
   a buffer layer between one of the two electrodes and the organic acceptor layer; and
   a charge transfer layer between the other of the two electrodes and the mixed organic donor layer,
   wherein the mixed organic donor layer comprises a mixture of a donor material chosen from phthalocyanines, subphthalocyanines, naphthalocyanines, merocyanine dyes, boron-dipyrromethene (BODIPY) dyes, thiophenes, polyacenes, and squaraine (SQ) dyes and at least one donor sensitizer chosen from subphthalocyanines, porphyrins, phthalocyanines, dipyrrins and metal complexes thereof, boboron-dipyrromethene (BODIPY) dyes, squaraines, oligothiophenes, and acenes and derivatives thereof, wherein the donor material and the at least one donor sensitizer are chosen to satisfy the following conditions:
   the at least one donor sensitizer has a lowest triplet excited state energy ($E_{T-DSens}$) greater than or equal to a lowest triplet excited state energy ($E_{T-D}$) of the donor material;
   the at least one donor sensitizer has an oxidation potential greater than or equal to an oxidation potential of the donor material; and
   if the at least one donor sensitizer and the donor material form a charge transfer (CT) state having a CT state energy, the CT state energy is greater than or equal to the lowest triplet excited state energy ($E_{T-D}$) of the donor material,
   wherein the at least one donor sensitizer results in an unaltered short circuit current ($J_{SC}$) and an increase in power conversion efficiency ($\eta_p$).

2. The device of claim 1, wherein the donor material and the at least one donor sensitizer are chosen such that the at least one donor sensitizer has a lowest singlet excited state energy ($E_{S-DSens}$) greater than or equal to a lowest singlet excited state energy ($E_{S-D}$) of the donor material.

3. The device of claim 1, wherein the donor material and the at least one donor sensitizer are chosen such that the CT state energy is greater than or equal to a lowest singlet excited state energy ($E_{S-D}$) of the donor material.

4. The device of claim 1, wherein the mixture of the donor material and the at least one donor sensitizer form a solid solution.

5. The device of claim 1, wherein the at least one donor sensitizer has an absorptivity of at least $10^3$ cm⁻¹ at one or more wavelengths ranging from 350 to 950 nm.

6. The device of claim 1, wherein the at least one donor sensitizer has a maximum absorptivity at one or more wavelengths, the maximum absorptivity of the at least one donor sensitizer being at least twice as large as an absorptivity of the donor material at the one or more wavelengths.

7. The device of claim 1, wherein the mixture of a donor material and at least one donor sensitizer has a donor:sensitizer ratio in a range of 10:1 to 1:2.

8. The device of claim 1, wherein the mixed donor layer has a thickness in a range of 20 to 70 nm.

9. The device of claim 1, further comprising an intermediate donor layer located between the mixed donor layer and the acceptor layer, wherein the intermediate donor layer consists of the donor material and forms a donor-acceptor heterojunction with the acceptor layer.

10. The device of claim 9, wherein the intermediate donor layer has a thickness in a range of 10 to 50 nm.

* * * * *